United States Patent
Kondo

(10) Patent No.: US 7,228,018 B2
(45) Date of Patent: Jun. 5, 2007

(54) OPTICAL INTERCONNECTION CIRCUIT, MANUFACTURING METHOD THEREOF, ELECTRO-OPTICAL DEVICE AND ELECTRONIC EQUIPMENT

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 227 days.

(21) Appl. No.: 10/673,444

(22) Filed: Sep. 30, 2003

(65) Prior Publication Data

US 2004/0109629 A1   Jun. 10, 2004

(30) Foreign Application Priority Data

Oct. 1, 2002   (JP) ............................ 2002-289077

(51) Int. Cl.
*G02B 6/12* (2006.01)
*G02B 6/10* (2006.01)

(52) U.S. Cl. ......................................... 385/14; 385/129

(58) Field of Classification Search ............ 385/14–15, 385/27, 37, 88–89, 129, 130, 147; 398/82
See application file for complete search history.

(56) References Cited

U.S. PATENT DOCUMENTS

| | | | |
|---|---|---|---|
| 5,073,230 A | 12/1991 | Maracas et al. | |
| 5,244,818 A | 9/1993 | Jokerst et al. | |
| 5,262,656 A * | 11/1993 | Blondeau et al. | ............. 385/14 |
| 5,280,184 A | 1/1994 | Jokerst et al. | |
| 5,286,335 A | 2/1994 | Drabik et al. | |
| 5,391,257 A | 2/1995 | Sullivan et al. | |
| 5,401,983 A | 3/1995 | Jokerst et al. | |
| 5,465,009 A | 11/1995 | Drabik et al. | |
| 5,650,123 A * | 7/1997 | Saini et al. | ................ 385/14 X |
| 5,827,751 A | 10/1998 | Nuyen | |
| 6,033,995 A | 3/2000 | Muller | |
| 6,045,756 A * | 4/2000 | Carr et al. | ................ 422/82.11 |
| 6,214,733 B1 | 4/2001 | Sickmiller | |
| 6,845,184 B1 | 1/2005 | Yoshimura et al. | |
| 6,868,214 B1 * | 3/2005 | Sakata et al. | ............... 385/129 |
| 7,020,361 B2 | 3/2006 | Thiele et al. | |
| 2004/0136715 A1 * | 7/2004 | Kondo | ........................ 398/82 |
| 2004/0154733 A1 | 8/2004 | Morf | |

FOREIGN PATENT DOCUMENTS

| | | |
|---|---|---|
| JP | A 54-130143 | 10/1979 |
| JP | 60-137458 | 9/1985 |
| JP | A 61-121014 | 6/1986 |
| JP | A 5-100246 | 4/1993 |
| JP | A 2000-056725 | 2/2000 |
| JP | A 2000-114581 | 4/2000 |
| JP | A 2001-042150 | 2/2001 |
| JP | A 2001-074960 | 3/2001 |

(Continued)

*Primary Examiner*—Quyen Leung
(74) *Attorney, Agent, or Firm*—Oliff & Berridge, PLC

(57) ABSTRACT

The invention provides an optical interconnection circuit, of which a signal transmission speed can be increased, and which can be easily microminiaturized and manufactured, a manufacturing method thereof, an electro-optical device including the circuit, and electronic equipment including the circuit. An optical interconnection circuit includes: a first micro tile element having a light emitting function; a second micro tile element having a light receiving function; which are attached to a substrate, and an optical wave-guide including an optical wave-guide member formed on the substrate to connect at least the first micro tile element and the second micro tile element each other.

32 Claims, 21 Drawing Sheets

FOREIGN PATENT DOCUMENTS

| | | |
|---|---|---|
| JP | A 2001-185752 | 7/2001 |
| JP | A 2001-188146 | 7/2001 |
| JP | A 2001-242331 | 9/2001 |
| JP | A 2002-009379 | 1/2002 |
| JP | A 2002-098851 | 4/2002 |
| JP | A 2002-252418 | 9/2002 |
| JP | A 2002-303751 | 10/2002 |
| JP | A 2003-536098 | 12/2003 |
| JP | A 2004-537158 | 12/2004 |
| WO | WO 99/17142 | 4/1999 |

\* cited by examiner

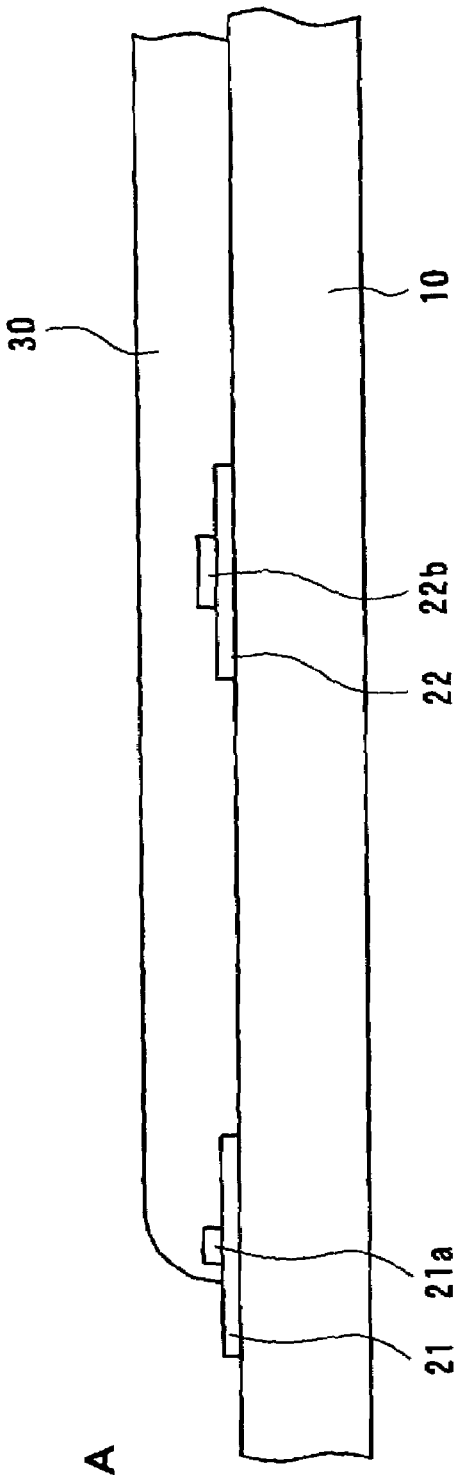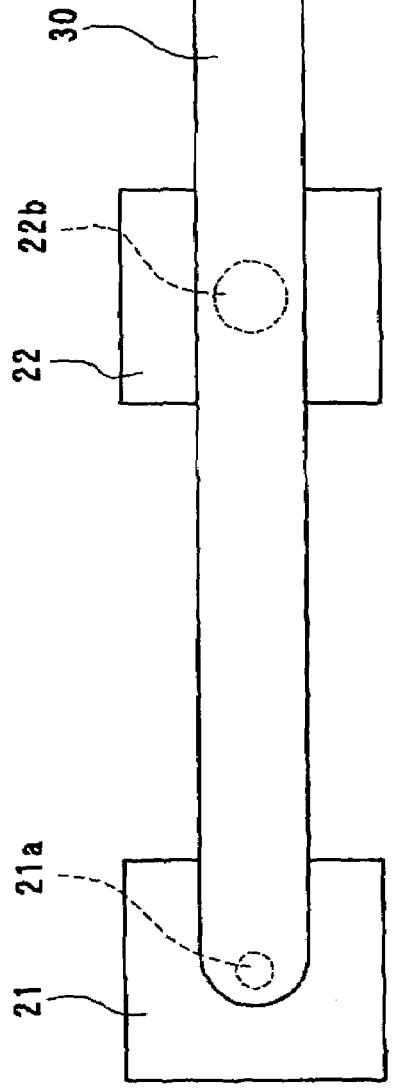
FIG. 1A
FIG. 1B

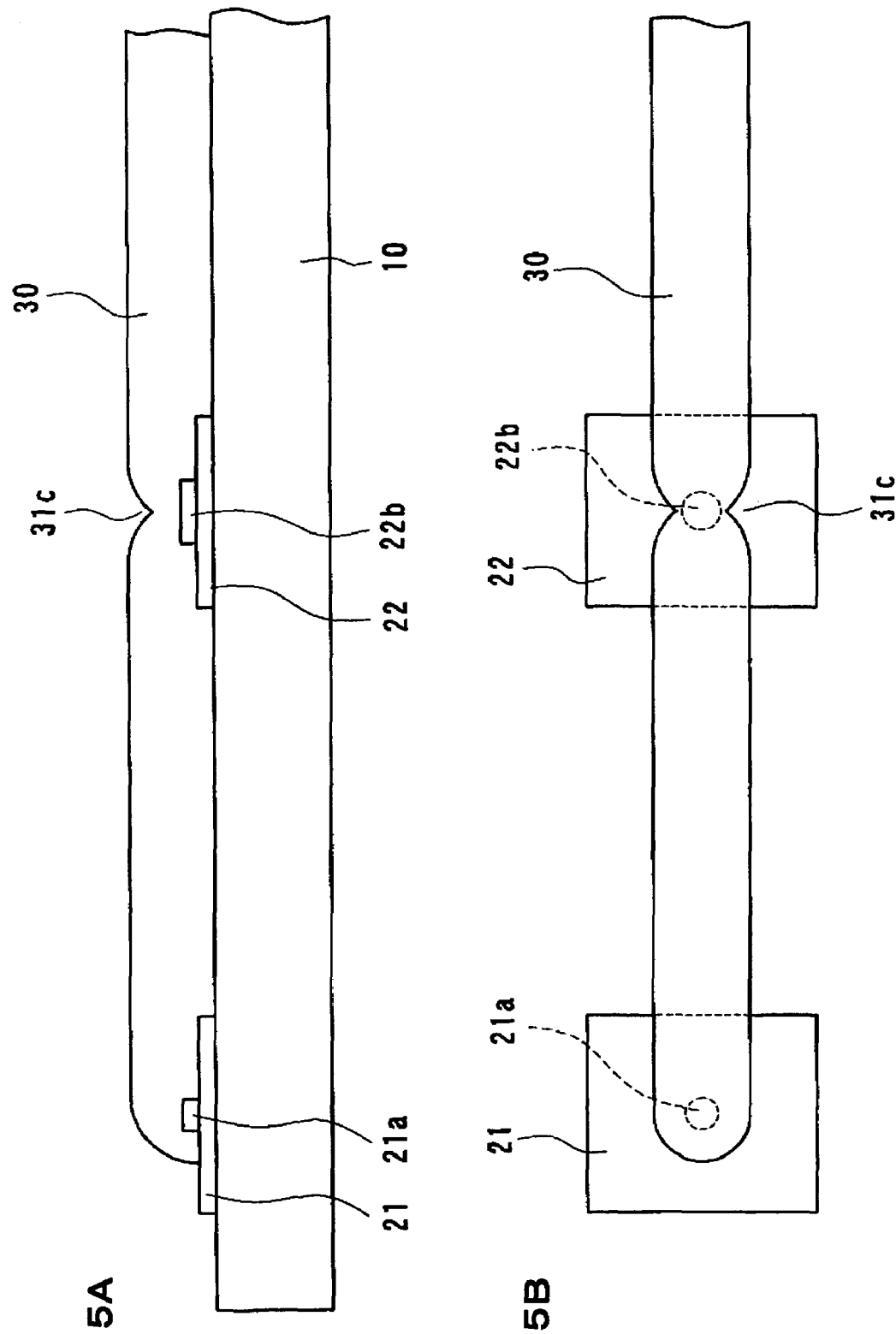

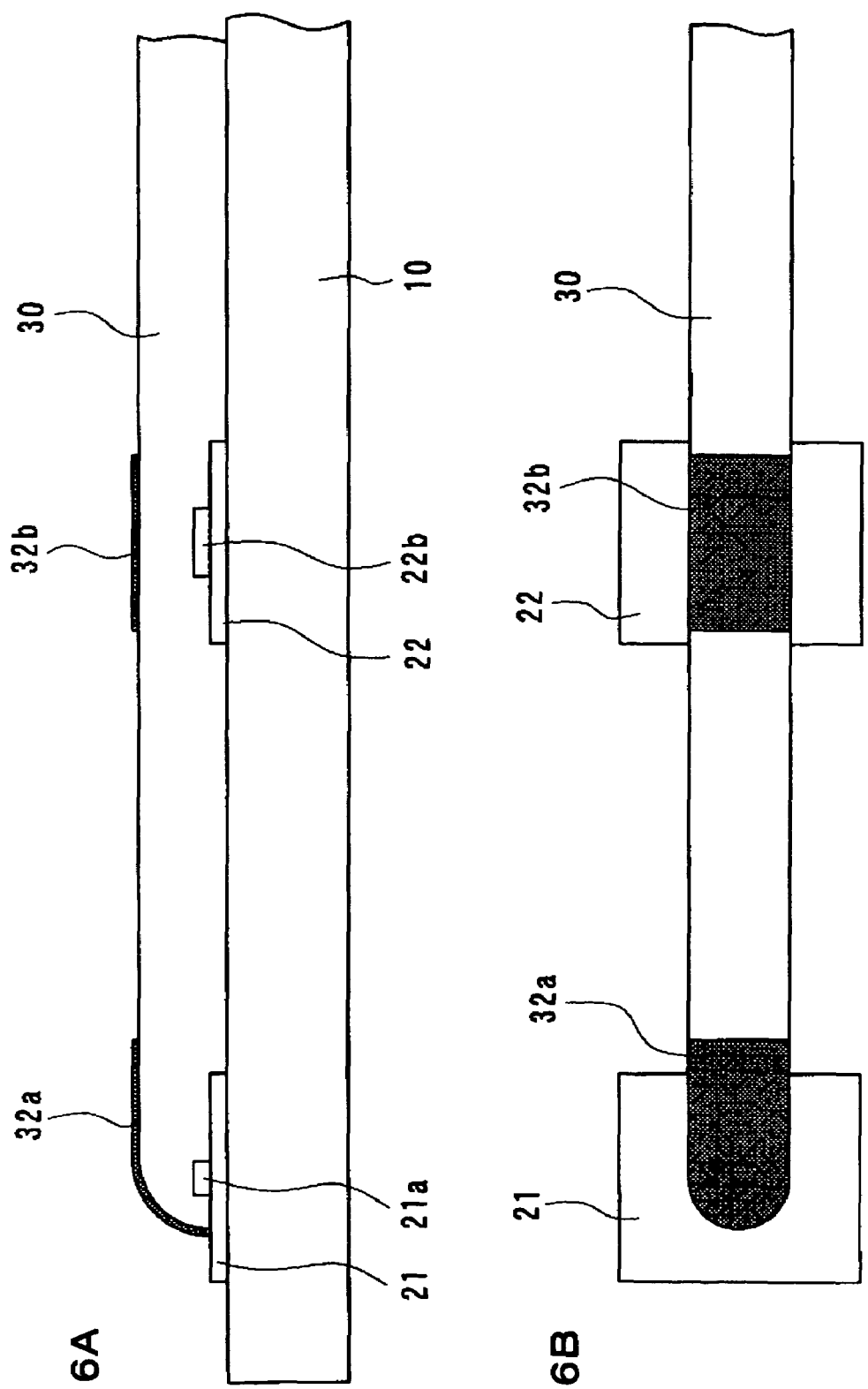

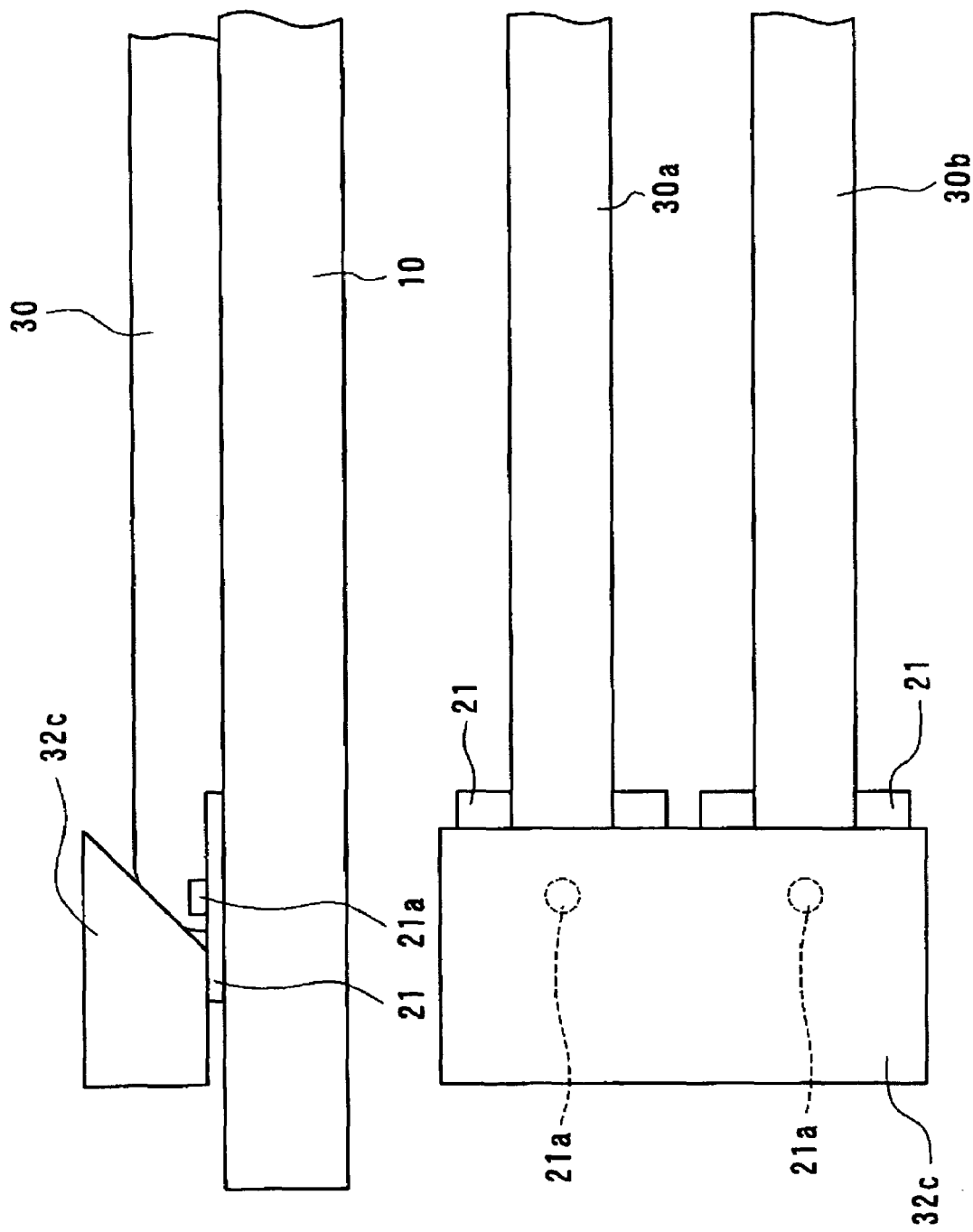

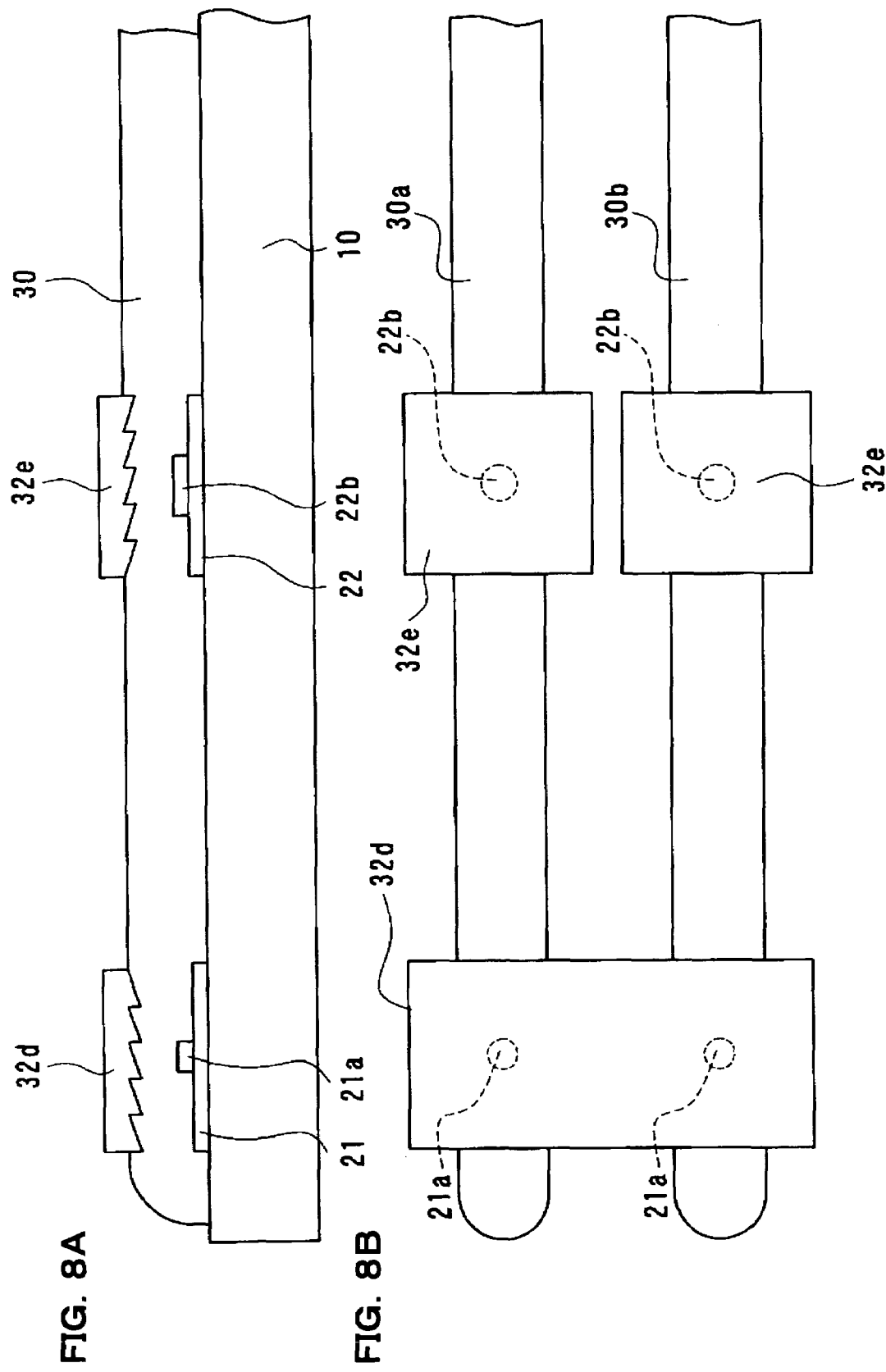

OPTICAL INTERCONNECTION CIRCUIT, MANUFACTURING METHOD THEREOF, ELECTRO-OPTICAL DEVICE AND ELECTRONIC EQUIPMENT

BACKGROUND OF THE INVENTION

1. Field of Invention

The present invention relates to an optical interconnection circuit, a method of manufacturing an optical interconnection circuit, an electro-optical device, and electronic equipment.

2. Description of Related Art

The related art uses an electro luminescence panel (an ELP), a plasma display panel (a PDP), a liquid crystal display device (an LCD), and the like as a flat display device. In these flat display devices, light can be used for signal transmission in order to address or solve delay of a signal and the like according with increase in the size of a display and an amount of contents displayed, as disclosed in Japanese Unexamined Patent Application Publication No. 5-100246.

Further, the related art has enhanced operation speed (operation clock) of an inside of a CPU in a computer because of microminiaturization of an inside structure of an integrated circuit. However, signal transmission speed of a bus connecting a CPU to a peripheral device, such as a storage device, has almost reached its limit in the related art so as to be a bottleneck of processing speed of a computer. If a signal in a bus can be transmitted by an optical approach, the limit of processing speed of a computer can be remarkably enhanced.

In addition, an optical transmission device, which transmits an optical signal emitted from a light source to a predetermined place so as to input the optical signal to a light receiving element, is needed in order to transmit a data by using an optical signal. In the related art, such an optical transmission device includes a device utilizing an optical fiber and a device utilizing an optical wave-guide formed on a substrate.

SUMMARY OF THE INVENTION

However, when an optical fiber is utilized as an optical transmission device, connecting an optical fiber to an optical part, such as a light emitting element and a light receiving element, is complicated so as to require a lot of cost and time for manufacturing, and makes it difficult to downsize an optical transmission device.

On the contrary, it is considered that an optical transmission medium is easily connected to a light emitting element, a light receiving element, and the like by utilizing an optical wave-guide formed on a substrate. However, the related art does not include an input-output structure suitable for an optical wave-guide, and the related art does not include an optical transmission device with microminiaturization and facilitation of manufacturing to the extent that such devices can be applied to a flat display device or a computer.

In view of the above issue, the present invention provides an optical interconnection circuit, of which signal transmission speed can be enhanced, and which can be easily microminiaturized and manufactured, a manufacturing method thereof, an electro-optical device including the circuit, and electronic equipment including the circuit.

To address or achieve the above, an optical interconnection circuit of the present invention includes: at least two micro tile elements installed on a substrate and having a light emitting function and/or a light receiving function; and an optical wave-guide including an optical wave-guide member formed on the substrate to connect at least the two micro tile elements each other.

According to the present invention, an optical signal emitted from the micro tile element having the light emitting function transmits in the optical wave-guide member and can reach the micro tile element having the light receiving function such that an optical signal can be sent and received between the micro tile elements. Therefore, according to the present invention, a very high speed signal transmission device can be easily realized. Further, a very small signal transmission device can be easily manufactured by greatly downsizing the micro tile element (for example, which has area of several hundred μm square or less and depth of several dozen μm or less). In the present invention, a transparent resin or a sol-gel glass can be applied as the optical wave-guide member. A sol-gel glass is a solid glass transformed by heating a solution including a glass component, and the like.

Further, in the optical interconnection circuit of the present invention, it is preferable that at least the two micro tile elements are bonded to a flat plane of the substrate and include a first micro tile element emitting an optical signal and a second micro tile element receiving the optical signal; and the optical wave-guide member of the optical wave-guide is formed on the flat plane of the substrate to cover a light emitting part of the first micro tile element and a light receiving part of the second micro tile element, and having a function to transmit the optical signal emitted from the first micro tile element to the second micro tile element.

According to the present invention, the first micro tile element and the second micro tile element can be easily bonded to any position on the substrate by using an adhesive and the like. Further, an optical signal can be transmitted from the first micro tile element to the second micro tile element. Here, the micro tile element can be easily handled and deposited on a precise position by, for example, temporarily bonding the micro tile element to one side of a flexible tape (film).

Further, in the optical interconnection circuit of the present invention, it is preferable that the optical wave-guide member of the optical wave-guide is installed in a linear or planar manner on the flat plane of the substrate.

According to the present invention, for example, connecting the first micro tile element to the second micro tile element via the optical wave-guide member installed in a line manner allows an optical signal to be transmitted in the optical wave-guide member such that an optical signal can be transmitted between the first and the second micro tile elements.

In addition, according to the present invention, for example, installing the optical wave-guide member in a linear or planar manner to cover one first micro tile element and a plurality of second micro tile elements enables an optical signal emitted from one first micro tile element to be simultaneously received by the plurality of second micro tile elements such that signal transmission of higher speed can be performed.

In addition, according to the present invention, for example, installing the optical wave-guide member in a linear or planar manner to cover a plurality of first micro tile elements and a plurality of second micro tile elements enables signal transmission of high speed between the plurality of first micro tile elements and the plurality of second micro tile elements. Here, making a light wavelength of emitted optical signal be different from each first micro tile element enables a bus using an optical signal to be easily constituted.

Further, in the optical interconnection circuit of the present invention, it is preferable that the optical wave-guide includes a light scattering mechanism scattering light, which is installed in the vicinity of at least one of the first micro tile element and the second micro tile element.

According to the present invention, for example, installing the light scattering mechanism in the vicinity of the first micro tile element in the optical wave-guide member constituting the optical wave-guide allows an optical signal emitted from the first micro tile element to be scattered by the light scattering mechanism such that an optical signal can be efficiently transmitted to throughout the optical wave-guide member. In addition, for example, installing the light scattering mechanism in the vicinity of the second micro tile element in the optical wave-guide member constituting the optical wave-guide allows an optical signal transmitted in the optical wave-guide to be scattered in the vicinity of the second micro tile element such that an optical signal can be efficiently input to the second micro tile element.

Hence, according to the present invention, for example, even if an optical signal is emitted from the first micro tile element perpendicularly to a surface of the substrate, the optical signal is scattered at the light scattering mechanism so as to be efficiently transmitted in the optical wave-guide member. In addition, for example, even if the light receiving part of the second micro tile element is disposed parallel to a surface of the substrate, an optical signal scattered by the light scattering mechanism can be efficiently and precisely input to the light receiving part of the second micro tile element.

Further, in the optical interconnection circuit of the present invention, it is preferable that the light scattering mechanism is composed of a resin into which a light scattering particle is mixed.

According to the present invention, the light scattering mechanism can be easily installed on any part of the optical wave-guide member constituting the optical wave-guide.

Further, in the optical interconnection circuit of the present invention, it is preferable that the light scattering mechanism is composed of a resin of which a surface is processed to include an irregularity thereon.

According to the present invention, for example, forming the irregularity on a desired part of a surface of the optical wave-guide member by embossing, stamper transferring, or the like after the optical wave-guide member constituting the optical wave-guide is formed on a surface of the substrate and the like enables the light scattering mechanism to be easily installed on any part of the optical wave-guide member constituting the optical wave-guide.

Further, in the optical interconnection circuit of the present invention, it is preferable that the light scattering mechanism is composed of the optical wave-guide member of which at least one of the line width and the height is changed.

According to the present invention, for example, in a case where the optical wave-guide member constituting the optical wave-guide is formed in a line manner on a surface of the substrate to cross over the second micro tile element, and the like, making the line width and the height of the optical wave-guide member over the upper part of the second micro tile element be smaller than those of other part enables the light scattering mechanism to be easily constituted.

Further, in the optical interconnection circuit of the present invention, it is preferable that the light scattering mechanism is composed of a resin or a glass in which a light scattering particle is dispersed, and is dome-shaped.

According to the present invention, controlling the size and the shape of the light scattering mechanism is easy such that optical coupling efficiency between the optical wave-guide, and the first micro tile element or the second micro tile element can be easily adjusted.

Further, in the optical interconnection circuit of the present invention, it is preferable that the optical wave-guide member is formed to cover the dome-shaped light scattering mechanism.

According to the present invention, the optical interconnection circuit of high optical coupling efficiency can be easily formed.

Further, in the optical interconnection circuit of the present invention, it is preferable that the optical wave-guide includes a light reflecting mechanism reflecting light, which is installed in the vicinity of at least one of the first micro tile element and the second micro tile element or on an edge part of the optical wave-guide member.

According to the present invention, a transmission direction of an optical signal emitted from the first micro tile element can be made be in a direction along the optical wave-guide by the light reflecting mechanism, in addition, an optical signal transmitting along the optical wave-guide can be oriented to the light receiving part of the second micro tile element by the light reflecting mechanism such that transmission efficiency of an optical signal can be easily enhanced.

Further, in the optical interconnection circuit of the present invention, it is preferable that the light reflecting mechanism includes a metal film formed on a surface of the optical wave-guide member.

According to the present invention, for example, attaching the metal film to a desired part of a surface of the optical wave-guide member after the optical wave-guide member constituting the optical wave-guide is formed on a surface of the substrate and the like enables the light reflecting mechanism to be easily installed on any part of the optical wave-guide member constituting the optical wave-guide.

Further, in the optical interconnection circuit of the present invention, it is preferable that the light reflecting mechanism is composed of the optical wave-guide member of which a surface is coated with a coating material including a metal particle.

According to the present invention, for example, applying the coating material including the metal particle to a desired part of the surface of the optical wave-guide member after the optical wave-guide member constituting the optical wave-guide is formed on a surface of the substrate and the like enables the light reflecting mechanism to be easily installed on any part of the optical wave-guide member constituting the optical wave-guide.

Further, in the optical interconnection circuit of the present invention, it is preferable that the light reflecting mechanism includes a reflection plate having a reflection plane attached to the edge part of the optical wave-guide member; and the reflection plate is disposed to be inclined to the flat plane of the substrate.

According to the present invention, attaching the reflection plate to the edge part of the optical wave-guide member to be inclined to the flat plane of the substrate enables, for example, an optical signal emitted from the first micro tile element perpendicularly to the flat plane of the substrate to be transmitted in a direction along the optical wave-guide by reflecting at the reflection plate. In addition, an optical signal transmitting along the optical wave-guide can be oriented to the second micro tile element by the reflection plate such that transmission efficiency of an optical signal can be easily enhanced.

Further, in the optical interconnection circuit of the present invention, it is preferable the optical wave-guide member is formed into the shape of a plurality of lines, which are approximately parallel each other, on the flat plane of the substrate; and the reflection plate is disposed on at least one edge of the plurality of lines, and is one common reflection plate reflecting light transmitting in each of the plural lines.

According to the present invention, for example, in a case where the optical wave-guide member formed into the shape of a plurality of lines constitutes a plurality of the optical wave-guides, and the first micro tile elements are disposed in one edge of each optical wave-guide, disposing one common reflection plate to be inclined to the flat plane of the surface to cover each first micro tile element enables a transmission direction of an optical signal emitted from each first micro tile element to be in a direction along the optical wave-guide.

Further, according to the present invention, for example, in a case where the optical wave-guide member formed into the shape of a plurality of lines constitutes a plurality of the optical wave-guides, and the second micro tile elements are disposed in the other edge of each optical wave-guide, disposing one common reflection plate to be inclined to the flat plane of the surface to cover each second micro tile element enables an optical signal transmitting in each optical wave-guide to be oriented to the light receiving part of each second micro tile element.

Further, in the optical interconnection circuit of the present invention, it is preferable that the optical wave-guide member is deposited on a metal wiring pattern installed on the substrate.

According to the present invention, installing the optical wave-guide member constituting the optical wave-guide to be stacked on the metal wiring pattern enables a device to be downsized such that, for example, a signal can be sent and received at high speed by the optical wave-guide as large electric power is provided by the metal wiring pattern.

In addition, according to the present invention, stacking the optical wave-guide on the metal wiring pattern enables an integrated circuit and the like to be downsized such that applying the present invention to a flat display device enables aperture ratio and the like to be enhanced.

Further, in the optical interconnection circuit of the present invention, it is preferable that the thickness of the micro tile element is twenty μm or less.

According to the present invention, for example, in a case where one or more micro tile element is disposed in the optical wave-guide including the optical wave-guide member, making the thickness of the micro tile element be twenty (20) μm or less enables a level difference between the substrate and the micro tile element to be made sufficiently small such that the optical wave-guide can be continuously formed crossing over the level difference. Even if the optical wave-guide is continuously formed on such level difference part, the level difference is so small that transmission losses of light due to scattering and the like can be nearly neglected. Therefore, according to the present invention, special structure and optical device to reduce the level difference are unnecessary on the level difference part such that the optical interconnection circuit, which can be easily manufactured at low cost, can be provided.

Further, in the optical interconnection circuit of the present invention, it is preferable that the first micro tile element is one of an LED, a surface emitting laser, and a DFB laser.

According to the present invention, the first micro tile element emitting an optical signal can be installed by, for example, cutting an LED, a surface emitting laser, a DFB laser, or the like which is formed on a substrate, into the shape of a micro tile. Because a surface emitting laser includes a compound semiconductor, it is not lattice matched to silicon so as to be very difficult to be directly formed on a silicon integrated circuit by a semiconductor process, such as an epitaxial method. Then, first, a surface emitting laser is formed on a gallium arsenide substrate. Next, the surface emitting laser is processed into a chip so as to install the first micro tile element. Such processing into a chip enables a surface emitting laser to be disposed on any position on a substrate such as silicon.

In addition, according to the present invention, using a DFB laser as the first micro tile element enables transmission efficiency of an optical signal to be furthermore enhanced such that the need of the light scattering mechanism and the light reflecting mechanism is reduced. The reason is that a DFB laser emits laser light from an edge part (a side part) of micro tile shape to a direction parallel to the flat plane of the substrate contrary to a surface emitting laser and an LED.

Further, in the optical interconnection circuit of the present invention, it is preferable that the second micro tile element is a photodiode or a phototransistor.

According to the present invention, the second micro tile element being downsized and a high sensitive light receiving device can be provided.

Further, in the optical interconnection circuit of the present invention, it is preferable that a third micro tile element is stacked on the first micro tile element.

According to the present invention, equipping the third micro tile element with a function to monitor quantity of light emitted from the first micro tile element or a function to output an optical signal, of which a wavelength is different from the first micro tile element enables the more sophisticated optical interconnection circuit to be provided.

Further, in the optical interconnection circuit of the present invention, it is preferable that the third micro tile element includes a detecting device to detect quantity of light emitted from the first micro tile element, and a controlling device to control light emitting operation of the first micro tile element based on the detected quantity of emitted light.

According to the present invention, detecting quantity of light emitted from the first micro tile element by the third micro tile element to feed the detected value back to a driver of the first micro tile element enables the optical interconnection circuit to have an APC function such that stable optical data transmission can be performed.

Further, in the optical interconnection circuit of the present invention, it is preferable that the photo diode is an MSM photo diode.

According to the present invention, constituting the second micro tile element by the MSM photo diode enables a high speed optical signal to be detected such that optical signal transmission of higher speed can be performed.

Further, in the optical interconnection circuit of the present invention, it is preferable that the micro tile element includes at least one of a circuit driving a light emitting element, a circuit controlling a light emitting element, and a circuit amplifying a light reception signal.

According to the present invention, equipping the micro tile element having a light emitting function or a light receiving function with a circuit producing an optical signal or a circuit detecting an optical signal enables the optical interconnection circuit to be furthermore downsized.

Further, in the optical interconnection circuit of the present invention, it is preferable that the micro tile element is electrically connected to an electronic circuit installed on the substrate.

According to the present invention, the speed of signal transmission in an electronic circuit such as an integrated circuit installed on a substrate can be increased by the optical interconnection circuit such that an integrated circuit of higher speed than a related art device, while maintaining a compact size, can be provided.

In addition, according to the present invention, for example, a scanning signal of a flat display and the like installed on a substrate can be transmitted at high speed by the optical interconnection circuit such that increase in the size and the quality of a screen in a flat display device can be promoted.

Further, in the optical interconnection circuit of the present invention, it is preferable that the micro tile element is installed by using a droplet ejecting method.

According to the present invention, the micro tile element having a desired function can be manufactured at low cost such that the low price optical interconnection circuit can be provided.

Further, in the optical interconnection circuit of the present invention, it is preferable that the micro tile element is installed by using a photolithography method.

According to the present invention, the micro tile element can be manufactured by using a general manufacturing device such that the optical interconnection circuit can be easily provided.

Further, a method of manufacturing an optical interconnection circuit of the present invention includes: bonding a plurality of micro tile elements to a substrate; and installing an optical wave-guide member on the substrate to connect at least two micro tile elements each other.

According to the present invention, the optical interconnection circuit, in which an optical signal is sent and received between the micro tile elements, can be easily manufactured.

Further, in the method of manufacturing an optical interconnection circuit of the present invention, it is preferable that the micro tile element includes a first micro tile element emitting an optical signal and a second micro tile element receiving the optical signal; and the optical wave-guide member is installed to transmit the optical signal emitted from the first micro tile element to the second micro tile element.

According to the present invention, a light emitting element, such as a semiconductor laser is processed into the shape of a micro tile to install the first micro tile element, and a light receiving element such as a photo diode is processed into the shape of a micro tile to install the second micro tile element, as a result, the first and the second micro tile elements can be bonded onto any position of the substrate by using an adhesive and the like.

Hence, an optical signal can be transmitted from the first micro tile element to the second micro tile element. For example, handling the micro tile element by temporarily bonding it to one side of a flexible tape (film) enables the size of the micro tile element (a semiconductor element), which can be handled, to be downsized compared to one of a related art mounting technique such that the micro tile element can be easily handled and deposited on a precise position.

In addition, the micro tile element may be either of a compound semiconductor or a silicon semiconductor, and a substrate which the micro tile element is bonded to may be any of a silicon semiconductor substrate, a compound semiconductor substrate, or other material. Hence, according to the present invention, as a surface emitting laser or a photo diode, which is made of gallium arsenide, is formed on a silicon semiconductor substrate (such as an integrated circuit substrate) or a glass substrate (such as a flat display device), the optical interconnection circuit can be constituted by forming the micro tile element on a substrate of which material is different from the micro tile element. In addition, a device is cut into the shape of a micro tile after a semiconductor element constituting the micro tile element is completed on a semiconductor substrate such that the micro tile element can be previously tested so as to be selected before the optical interconnection circuit is manufactured.

Further, in the method of manufacturing an optical interconnection circuit of the present invention, it is preferable that the optical wave-guide member is installed by coating the substrate and the micro tile element with a light curable resin, thereafter irradiating only an area of a desired pattern with light for patterning.

According to the present invention, the optical wave-guide including the optical wave-guide member of desired shape can be easily formed by using a related art manufacturing device.

Further, in the method of manufacturing an optical interconnection circuit of the present invention, it is preferable that the optical wave-guide member is installed by coating the substrate and the micro tile element with a desired resin, thereafter using a photolithography method to pattern desired shape.

According to the present invention, for example, dry or wet etching a resin applied to the substrate with a mask, such as a resist, enables the optical wave-guide including the optical wave-guide member of desired shape to be easily formed.

Further, in the method of manufacturing an optical interconnection circuit of the present invention, it is preferable that the coating is performed by using one of a spin coating method, a roll coating method, and a spray coating method.

According to the present invention, the optical wave-guide including the optical wave-guide member can be formed by using any coating method of various coating methods.

Further, in the method of manufacturing an optical interconnection circuit of the present invention, it is preferable that the optical wave-guide member is installed by using a droplet ejecting method.

According to the present invention, the optical wave-guide including the optical wave-guide member of any shape can be easily formed by the droplet ejecting method. In addition, using the droplet ejecting method can reduce an amount of the optical wave-guide member wasted in a manufacturing process.

Further, in the method of manufacturing an optical interconnection circuit of the present invention, it is preferable that the optical wave-guide member is installed by installing a lyophobic area and a lyophilic area, which have a desired pattern, on a flat plane of the substrate and a surface of the micro tile element, thereafter ejecting a resin onto the flat plane of the substrate and the micro tile element by the droplet ejecting method.

According to the present invention, installing the lyophobic area and the lyophilic area, which have a desired pattern, on the substrate and ejecting the resin onto the lyophilic area enables the optical wave-guide including the optical waveguide member to be formed into more precise shape.

Further, in the method of manufacturing an optical interconnection circuit of the present invention, it is preferable that the optical wave-guide member is installed by a pattern transferring method using a stamper.

According to the present invention, the optical wave-guide including the optical wave-guide member of desired shape can be easily formed by the pattern transferring method.

Further, in the method of manufacturing an optical interconnection circuit of the present invention, it is preferable that the optical wave-guide member is installed by using a printing method.

According to the present invention, the optical wave-guide including the optical wave-guide member of desired shape can be easily formed by the printing method.

Further, in the method of manufacturing an optical interconnection circuit of the present invention, it is preferable that the optical wave-guide member is installed by using a slit coating method in which a liquid resin is ejected from a slit-shaped gap.

According to the present invention, the optical wave-guide including the optical wave-guide member of desired shape can be easily formed by the slit coating method.

Further, in the method of manufacturing an optical interconnection circuit of the present invention, it is preferable that the micro tile element is installed by using the droplet ejecting method.

According to the present invention, a required amount of material to form the micro tile element can be reduced such that the low price optical interconnection circuit can be provided.

Further, in the method of manufacturing an optical interconnection circuit of the present invention, it is preferable that the micro tile element is installed by using the photolithography method.

According to the present invention, the micro tile element can be manufactured by using a general manufacturing device such that the optical interconnection circuit can be easily manufactured.

Further, an electro-optical device of the present invention includes the optical interconnection circuit.

According to the present invention, for example, transmitting a scanning signal of a flat display and the like by the optical interconnection circuit enables a scanning signal to be transmitted at high speed such that increase in the size and the quality of a screen in a flat display device can be realized.

Electronic equipment of the present invention includes the optical interconnection circuit.

According to the present invention, for example, applying the optical interconnection circuit of the present invention to an integrated circuit enables electronic equipment, which can process a signal at high speed and is downsized, to be provided at low cost.

In addition, according to the present invention, for example, applying the optical interconnection circuit of the present invention to a display device enables electronic equipment capable of displaying an image of high quality to be provided at low cost.

BRIEF DESCRIPTION OF THE DRAWINGS

FIGS. 1A and 1B are schematics of a circuit related to a first exemplary embodiment of the present invention;

FIGS. 5A and 5B are schematics of another circuit related to the second exemplary embodiment of the present invention;

FIGS. 6A and 6B are schematics of a-circuit related to a third exemplary embodiment of the present invention;

FIGS. 7A and 7B are schematics of another circuit related to a third exemplary embodiment of the present invention;

FIGS. 8A and 8B are schematics of another circuit related to a third exemplary embodiment of the present invention;

DETAILED DESCRIPTION OF PREFERRED EMBODIMENTS

Figure 2:
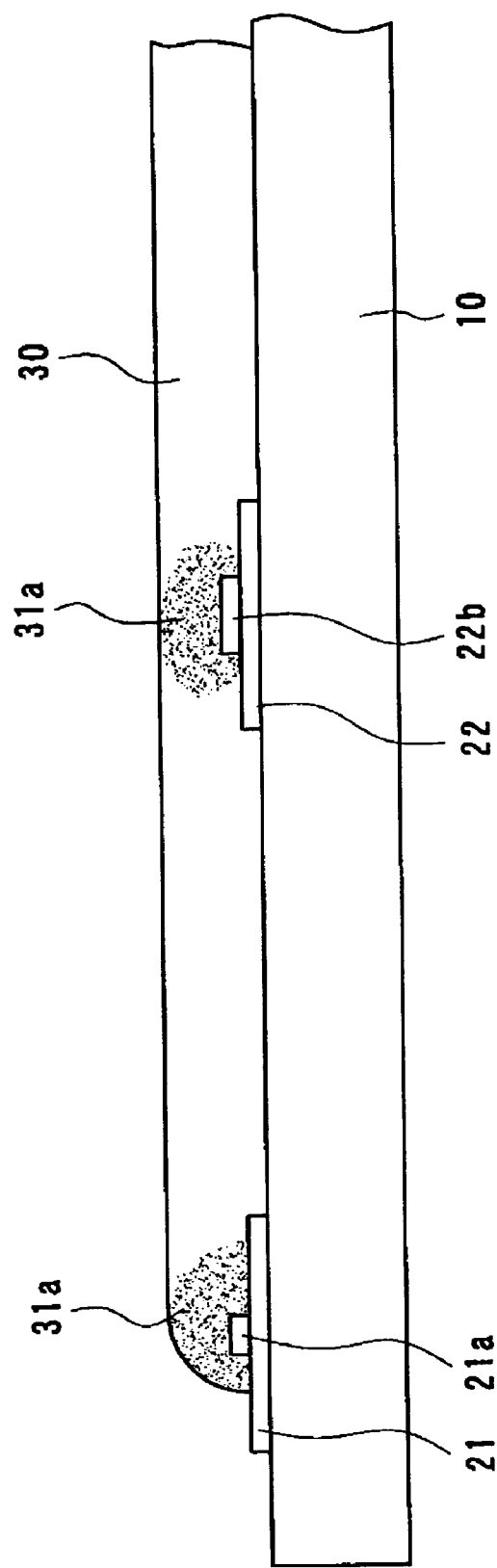
FIG. 2 is a schematic side view of a circuit related to a second exemplary embodiment of the present invention.

An optical interconnection circuit related to the present invention is described below referring to drawings.

First Exemplary Embodiment

FIGS. 1A and 1B show an optical interconnection circuit related to a first exemplary embodiment of the present invention. FIGS. 1A and 1B are a schematic sectional view and a schematic plan view, respectively. The optical interconnection circuit related to the present exemplary embodiment includes a first micro tile element 21, a second micro tile element 22, which are bonded to a surface of a substrate 10, and an optical wave-guide 30 including an optical wave-guide member formed on the surface of the substrate 10 to connect the first micro tile element 21 and the second micro tile element 22 each other. A transparent resin or a sol-gel glass can be applied as the optical wave-guide member. Any material, such as a glass epoxy, a ceramic, a plastic, a polyimide, silicon, or a glass can be applied as the substrate 10.

The first micro tile element 21 and the second micro tile element 22 are semiconductor devices having the shape of a micro tile (micro tile elements). This micro tile element is, for example, a plate member of which the thickness is twenty (20) μm or less, and the length and the width is from several dozen μm through several hundred μm. A method of manufacturing the micro tile element is described in detail below.

The first micro tile element 21 includes a light emitting part 21a having a light emitting function. The second micro tile element 22 includes a light receiving part 22b having a light receiving function. In addition, the optical wave-guide member constituting the optical wave-guide 30 is formed to cover at least the light emitting part 21a of the first micro tile element 21 and the light receiving part 22b of the second micro tile element 22.

The above structure allows light emitted from the light emitting part 21a of the first micro tile element 21 to be transmitted in the optical wave-guide 30 so as to reach the light receiving part 22b of the second micro tile element 22. Namely, when light emitting operation of the light emitting part 21a is controlled to emit an optical signal from the light emitting part 21a, the optical signal transmits in the optical wave-guide 30 such that the light receiving part 22b can detect the optical signal transmitted in the optical wave-guide 30.

Further, an optical signal emitted from the first micro tile element 21 transmits in the optical wave-guide 30 to pass through over the second micro tile element 22, while enter the second micro tile element 22. This enables an optical signal to be almost simultaneously sent from one first micro tile element 21 to a plurality of second micro tile element 22. Making the thickness of the second micro tile element 22 be twenty (20) μm or less substantially reduces a level difference from the substrate such that the optical wave-guide 30 can be continuously formed crossing over the level difference as shown in FIG. 1. Even if the optical wave-guide 30 is continuously formed on a level difference part, the level difference is so small that transmission losses of light due to scattering and the like can be nearly neglected. Therefore, special structure and optical device to reduce the level difference are unnecessary on the level difference part. Hence, the optical interconnection circuit can be easily manufactured at low cost. In addition, the thickness of the optical wave-guide member constituting the optical wave-guide 30 can be made several dozen Jim or less.

The first micro tile element 21 includes, for example, an LED, a VCSEL (a surface emitting laser), or a DFB (distributed feedback) laser incorporating an electroabsorption modulator. Though an LED has the simplest structure and is easy to be manufactured as a light emitting device, the speed of modulating an optical signal thereof is about several hundred Mbps, which is slow. On the contrary, a VCSEL can modulate at very high speed, which is over ten (10) Gbps, and can drive with low power consumption because of small threshold current and high light emission efficiency thereof. Though the modulating speed of a DFB laser is about one (1) Gbps, which is inferior to a surface emitting laser, a DFB laser emits laser light from a edge part of micro tile shape to a direction parallel to a flat plane of the substrate 10, namely a direction along the optical wave-guide 30, such that an optical signal can be transmitted more efficiently than a surface emitting laser.

The second micro tile element 22 includes, for example, a photodiode or a phototransistor. A PIN photodiode, an APD (an avalanche photodiode), and an MSM photodiode can be used as a photodiode according to usage. Both optical sensitivity and response frequency of an APD are high. A MSM photodiode has a simple structure and is easy to be integrated with a transistor for amplifying.

Further, a third micro tile element (not shown in the drawing) including a light receiving element can be formed to be stacked on the first micro tile element 21. This allows the third micro tile element to monitor quantity of light emitted from the first micro tile element 21 to feed the value back to the first micro tile element 21 so as to enable an APC function to be equipped with such that stable optical data transmission can be realized. Alternatively, an APC function may be incorporated in the first micro tile element 21 itself. In addition, the second micro tile element 22 preferably includes a circuit, which amplifies a detected signal, and the like. This enables a device to be furthermore improved in performance.

Further, the first micro tile element 21 and the second micro tile element 22 are electrically connected to an integrated circuit installed on the substrate 10 or an electronic circuit (not shown in the drawing), such as a display circuit for an EL, a display circuit for a plasma display, and a display circuit for a liquid crystal. This enables a computer system including an integrated circuit and the like to be enhanced in operation speed than a related art one, while maintaining a compact size. In addition, a scanning signal of a flat display installed on the substrate 10 can be transmitted at high speed by the optical interconnection circuit of the present exemplary embodiment such that increase in the size and the quality of a screen in a flat display device can be promoted.

Though a single of first micro tile element 21 and a single of second micro tile element 22 are joined to a single of optical wave-guide 30 in FIGS. 1A and 1B, the second micro tile element 22 may include a plurality. In this case, an optical signal sent from one first micro tile element 21 (light emitting element) transmits in one optical wave-guide 30 and can be simultaneously detected at the plurality of second micro tile elements 22. This is the same as a one-to-many bus line.

Further, each of the first micro tile element 21 and the second micro tile element 22 may include a plurality. A wavelength of light emitted from each first micro tile element 21 may be different from each other. In addition, each second micro tile element 22 preferably acts as a light receiving device having a wavelength selecting function, by which received light is selected depending on a wavelength of light emitted from at least one first micro tile element 21. These enable a plurality of optical signals respectively output from the plurality of first micro tile elements 21 to simultaneously transmit through a single optical wave-guide 30 to be respectively detected by the plurality of second micro tile elements 22. Therefore, a bus capable of sending and receiving a plurality of optical signals in parallel each other can be easily constituted.

Further, though the optical wave-guide 30 is formed in a straight line manner in FIGS. 1A and 1B, it can be formed in a curved manner or be branched into plural. In addition, it may be formed in a loop manner. In addition, it may be formed in a sheet manner to cover a plurality of tile elements. Of course, a plurality of groups of the first micro tile element 21, the second micro tile element 22, and the optical wave-guide 30 may be formed on a surface of one substrate 10. Additionally, the first micro tile element 21, the second micro tile element 22, and the optical wave-guide 30 can be formed on both front and back sides of the substrate 10.

Second Exemplary Embodiment

An optical interconnection circuit related to a second exemplary embodiment of the present invention is described below referring to FIG. 2 through FIG. 5B. The present exemplary embodiment is different from the first exemplary embodiment in that a light scattering mechanism scattering light is formed on the optical wave-guide 30 in the vicinity of the first micro tile element 21 and the second micro tile element 22. FIG. 2 is a schematic side view showing one example of the optical interconnection circuit related to the second exemplary embodiment of the present invention.

In the present optical interconnection circuit, a light scattering particle constituting a light scattering mechanism 31*a* is dispersed in the vicinity of the first micro tile element 21 and the second micro tile element 22 on the optical wave-guide member constituting the optical wave-guide 30. For example, a silica particle, a glass particle, a metal particle, or the like is used as the light scattering particle. The optical wave-guide 30 including the light scattering mechanism 31*a* is formed by using a droplet ejecting method, in which a droplet is ejected from, for example, a dispenser, an ink jet nozzle, or the like. In particular, in addition to ejecting a liquid optical wave-guide member (a resin and the like) from an ink jet nozzle and the like onto a predetermined part, ejecting the liquid optical wave-guide member including the light scattering particle from other ink jet nozzle and the like onto a predetermined part forms the optical wave-guide 30 being provided with the light scattering mechanism 31*a*.

Further, a sol-gel glass other than a resin can be applied as a material of the optical wave-guide 30. A method of manufacturing the sol-gel glass includes: coating a predetermined part with a solvent, which is hydrolyzed by adding an acid to a metal alkoxide, and applying energy such as heat thereto to vitrify it.

Figure 3:
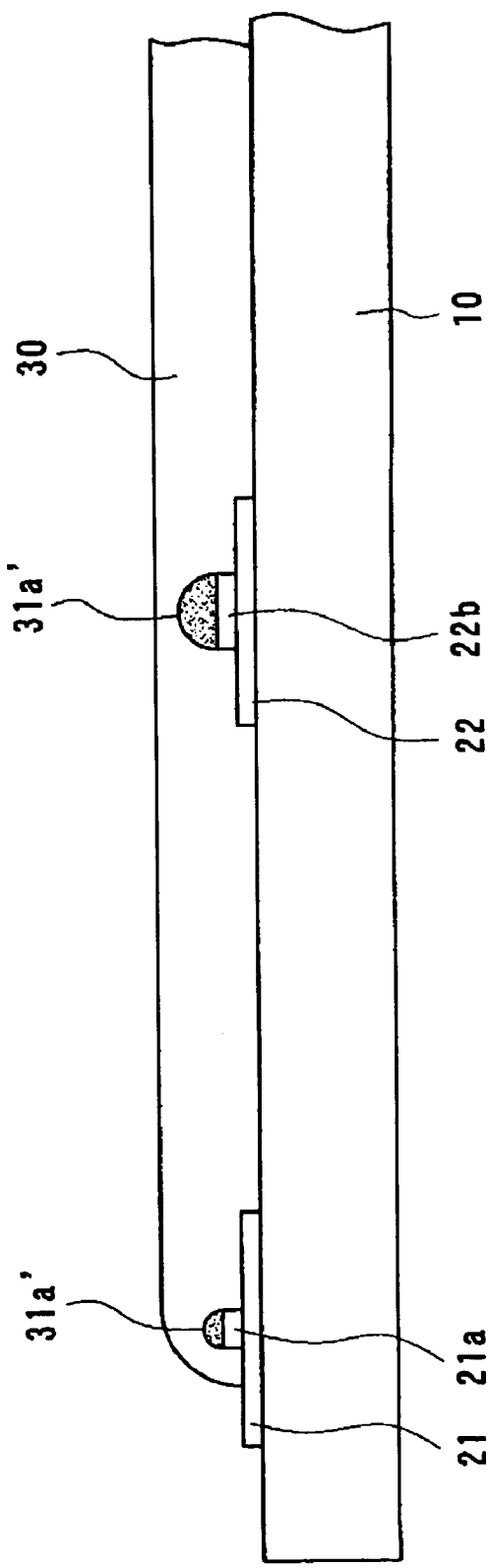
FIG. 3 is a schematic side view of another circuit related to the second exemplary embodiment of the present invention.

FIG. 3 is a schematic side view showing another example of the optical interconnection circuit related to the second exemplary embodiment. A light scattering mechanism 31*a'* of the present optical interconnection circuit is a dome-shaped light scattering mechanism including a resin or a glass, into which the light scattering particle is dispersed, formed into the shape of a dome.

The optical wave-guide 30 is formed to cover the light scattering mechanism 31*a'* (the dome-shaped light scattering mechanism). The size and the shape of the light scattering mechanism 31*a'* is easier to be controlled than the light scattering mechanism 31*a* shown in FIG. 2 such that optical coupling efficiency between the optical wave-guide 30, and the first micro tile element 21 or the second micro tile element 22 can be easily controlled.

A method of manufacturing the light scattering mechanism 31*a'* is described below. First, a liquid resin including the light scattering particle, a solvent hydrolyzed by adding an acid to a metal alkoxide, such as a silicate ethyl, or the like is applied to a predetermined part of the substrate 10 in a dome manner. Next, such solvent is cured or vitrified by applying energy such as heat to the applied part. Thus, the dome-shaped light scattering mechanism 31*a'* is formed on the first micro tile element 21 or the second micro tile element 22. Next, the optical wave-guide 30 of line-shaped is formed by a transparent resin or a sol-gel glass to cover the dome-shaped light scattering mechanism 31*a'*.

Figure 4:
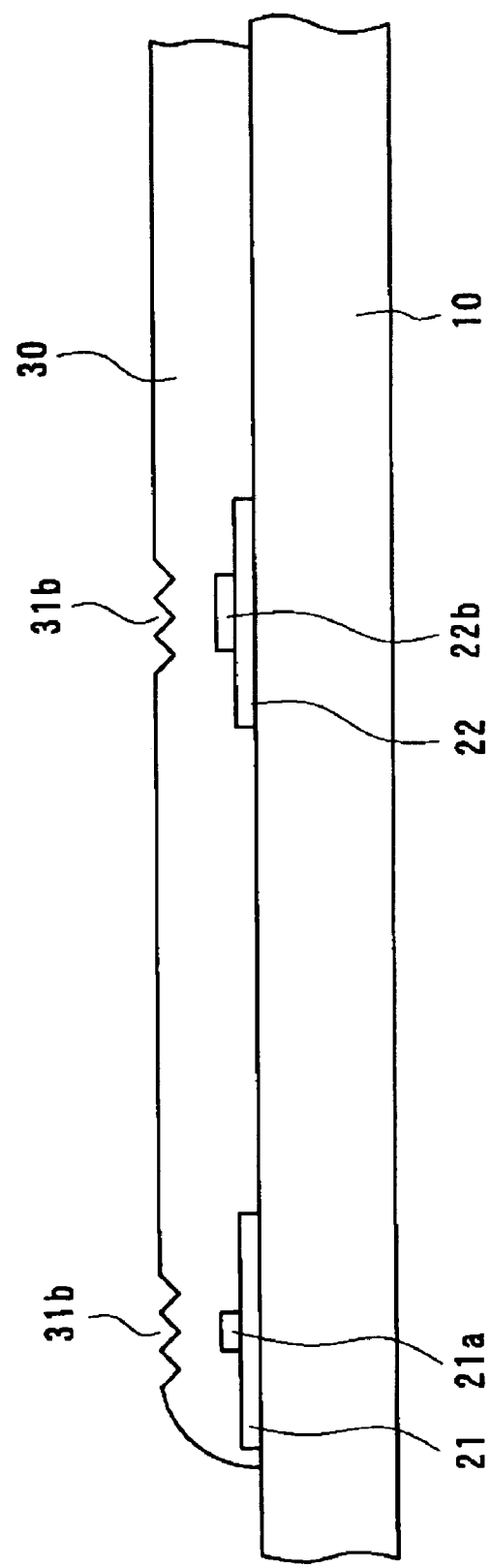
FIG. 4 is a schematic side view of another circuit related to the second exemplary embodiment of the present invention.

FIG. 4 is a schematic side view showing another example of the optical interconnection circuit related to the second exemplary embodiment. A light scattering mechanism 31*b* of the present optical interconnection circuit has a constitution, in which an cyclic concavity and convexity, for example diffraction grating, is installed on a surface of the optical wave-guide member constituting the optical wave-guide 30. This light scattering mechanism 31*b* is installed in the vicinity of the first micro tile element 21 and the second micro tile element 22, too. The irregularity constituting the light scattering mechanism 31*b* is formed by an embossing, a stamper transferring, or the like.

FIGS. 5A and 5B show one of other examples of the optical interconnection circuit related to the second exemplary embodiment. FIGS. 5A and 5B are a schematic side view and a schematic plan view, respectively. A light scattering mechanism 31*c* of the present optical interconnection circuit has a constitution, in which the width and/or the height of the line-shaped optical wave-guide member constituting the optical wave-guide 30 are changed. Namely, in the optical wave-guide 30, the width and/or the height of the optical wave-guide member in the vicinity of the light receiving part 22*b* of the second micro tile element 22 are narrowed down.

A method of manufacturing the optical wave-guide 30 including the light scattering mechanism 31*c* is described below. First, the first micro tile element 21 and the second micro tile element 22 are bonded to a desired part of a surface of the substrate 10. Next, a lyophobic treatment is performed for overall surfaces of the substrate 10, the first micro tile element 21, and the second micro tile element 22. Next, a lyophilic treatment is performed for an area, on which the optical wave-guide 30 is installed, on the lyophobic-treated surface. Here, the lyophilic-treated area has a line-shaped pattern, where line width is narrowed in the vicinity of the light receiving part 22*b* of the second micro tile element 22. Here, the lyophilic treatment is performed by, for example, irradiating ultraviolet ray.

Next, a liquid optical wave-guide member is dropped from an ink jet nozzle and the like onto the lyophilic-treated area. Then, such dropped optical wave-guide member receives an action to be spread in the lyophilic-treated area and an action to be expelled from the lyophobic-treated area. In addition, surface tension of the dropped material exists. Therefore, such optical wave-guide member becomes a form, where line width is narrowed in the vicinity of the light receiving part 22*b* as shown in FIGS. 5A and 5B.

As the above, installing the light scattering mechanisms 31a, 31b, and 31c in the vicinity of the first micro tile element 21 on the optical wave-guide 30 allows an optical signal emitted from the first micro tile element 21 to be scattered at the light scattering mechanisms 31a, 31b, and 31c such that an optical signal can be efficiently transmitted to throughout the optical wave-guide. In addition, installing the light scattering mechanisms 31a, 31b, and 31c in the vicinity of the second micro tile element 22 allows an optical signal transmitted in the optical wave-guide 30 to be scattered in the vicinity of the second micro tile element 22 such that an optical signal can be efficiently entered the second micro tile element 22.

Third Exemplary Embodiment

An optical interconnection circuit related to a third exemplary embodiment of the present invention is described below referring to FIG. 6A through FIG. 8B. The present exemplary embodiment is different from the first and the second exemplary embodiments in that a light reflecting mechanism reflecting light is formed in the vicinity of the first micro tile element 21 and the second micro tile element 22 on the optical wave-guide 30, or on an edge part of the optical wave-guide 30. FIGS. 6A and 6B show one example of the optical interconnection circuit related to the third exemplary embodiment of the present invention. FIGS. 6A and 6B are a schematic side view and a schematic plan view, respectively.

For example, light reflecting mechanisms 32a and 32b are installed by forming a metal film on a surface of the optical wave-guide member constituting the optical wave-guide 30. In addition, the light reflecting mechanisms 32a and 32b may be installed by applying a coating material including a metal particle to a surface of the optical wave-guide member constituting the optical wave-guide 30. A particle of silver, aluminum, magnesium, copper, nickel, titanium, chrome, and zinc can be applied as the metal particle. Forming the metal film constituting the light reflecting mechanisms 32a and 32b and applying the coating material including the metal particle may be performed by ejecting a coating material and the like from an ink jet nozzle and the like. Further, the light reflecting mechanism 32a or 32b may be formed on overall the optical wave-guide 30.

The above structure allows an optical signal emitted from the first micro tile element 21 to be reflected to a direction along the optical wave-guide 30 by the light scattering mechanism 32a, and allows a part of the optical signal to be reflected to the second micro tile element 22 by the light scattering mechanism 32b. Therefore, according to the present exemplary embodiment, an optical signal can be efficiently transmitted.

FIGS. 7A and 7B show other examples of the optical interconnection circuit related to the third exemplary embodiment. FIGS. 7A and 7B are a schematic side view and a schematic plan view, respectively. A light reflecting mechanism 32c of the present optical interconnection circuit has a constitution, where a reflection plate having a reflection plane is attached to an edge part of the optical wave-guide 30. The reflection plane of the light reflecting mechanism 32c is installed at, for example, a 45-degree angle to a surface of the substrate 10.

Further, two parallel optical wave-guides 30a and 30b are installed in the present optical interconnection circuit. In addition, the light reflecting mechanism 32c is installed on one edge of two optical wave-guides 30a and 30b, and is one common reflection plate shared by the optical wave-guides 30a and 30b. Hence, each optical signal respectively emitted from two first micro tile elements 21 is respectively reflected to a direction along the optical wave-guides 30a and 30b by the optical wave-guide 32c. Therefore, according to the present exemplary embodiment, an optical signal can be efficiently transmitted, while the optical interconnection circuit can be efficiently manufactured.

Though the common light reflecting mechanism 32c common to two optical wave-guides 30a and 30b is installed in the exemplary embodiment shown in FIGS. 7A and 7B, the common light reflecting mechanism 32c being common to three or more optical wave-guides may be installed.

FIGS. 8A and 8B show other examples of the optical interconnection circuit related to the third exemplary embodiment. FIGS. 8A and 8B are a schematic side view and a schematic plan view, respectively. Light scattering mechanisms 32d and 32e of the optical interconnection circuit are grated plate-shaped optical parts (grating parts). The light scattering mechanisms 32d and 32e are installed to cover the first micro tile element 21 and the second micro tile element 22, respectively.

In a case where an interval between the optical wave-guides 30a and 30b is large, the light scattering mechanism 32e are separately attached to each of the optical wave-guides 30a and 30b as shown in FIGS. 8A and 8B. In the other case where the optical wave-guides 30a and 30b are disposed to be close each other and approximately parallel each other, the light scattering mechanism 32d common to the optical wave-guides 30a and 30b may be attached as shown in FIGS. 8A and 8B.

The above light scattering mechanism and the light reflecting mechanism shown in FIG. 2 through FIG. 8B are more effective when combined.

(Method of Manufacturing)

Figure 9A:
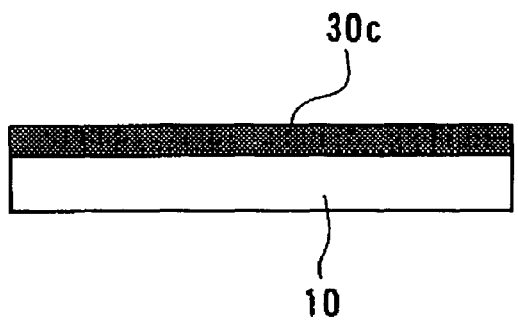
FIGS. 9A and 9B are schematic side views showing a method of manufacturing related to an exemplary embodiment of the present invention.
Figure 9B:
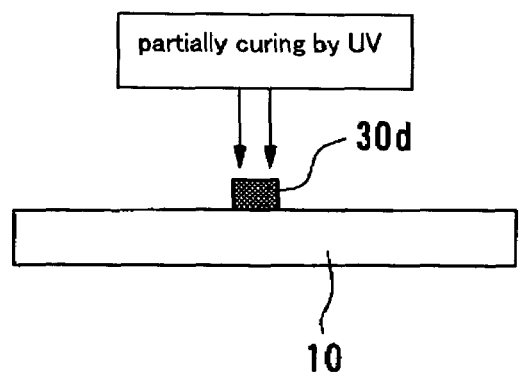

A method of manufacturing the optical wave-guide 30 in the optical interconnection circuit related to the above exemplary embodiment is described below referring to FIG. 9A through FIG. 12B. FIGS. 9A and 9B are schematic side views showing the method of manufacturing the optical wave-guide 30.

First, the first and the second micro tile elements are bonded to a top surface of the substrate 10 before a manufacturing process of the optical wave-guide 30. Next, overall the top surfaces of the substrate 10, the first micro tile element, and the second micro tile element (not shown in the drawing) are coated with a liquid light curable resin 30c, as shown in FIG. 9A. This coating is performed by a spin coating method, a roll coating method, a spray coating method, and the like.

Subsequently, the liquid light curable resin 30c is irradiated with ultraviolet ray (UV) through a mask of a desired pattern. This allows only a desired area of the liquid light curable resin 30c to be cured so as to perform patterning. Further, an optical wave-guide 30d including the cured optical wave-guide member is formed by removing the resin not cured by cleaning and the like, as shown in FIG. 9B.

Figure 10A:
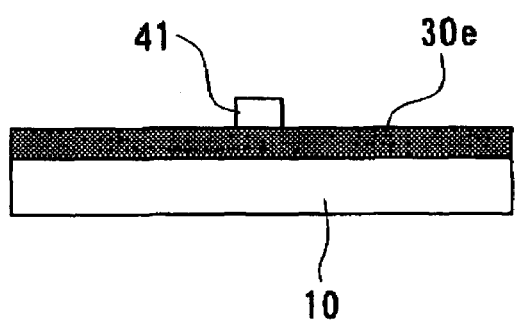
FIGS. 10A and 10B are schematic side views showing another method of manufacturing related to an exemplary embodiment of the present invention.
Figure 10B:
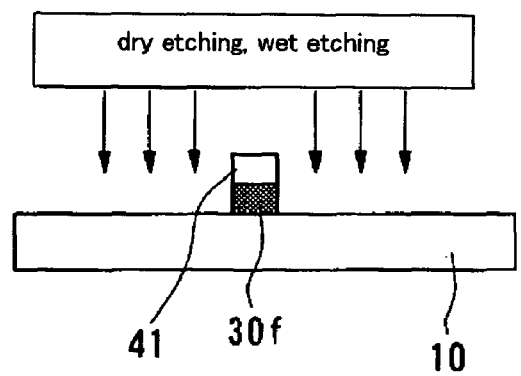

FIGS. 10A and 10B are schematic side views showing other examples of the method of manufacturing the optical wave-guide 30. First, the first and the second micro tile elements are bonded to a top surface of the substrate 10 before the manufacturing process of the optical wave-guide. Next, a resin 30e is coated to be cured on overall the top surfaces of the substrate 10, the first micro tile element, and the second micro tile element (not shown in the drawing) as shown in FIG. 10A. This coating is performed by a spin coating method, a roll coating method, a spray coating method, and the like. Subsequently, a resist mask 41 is formed on a desired area of the resin 30*e*. The area, where the resist mask 41 is formed on, is the same as the area, where the optical wave-guide 30 is formed on.

Then, dry or wet etching is performed for overall the substrate 10 through the resist mask 41 so as to remove the resin 30*e* other than under the resist mask 41. Performing such photolithographic patterning followed by removing the resist mask 41 forms an optical wave-guide 30*f* including the optical wave-guide.

Figure 11A:
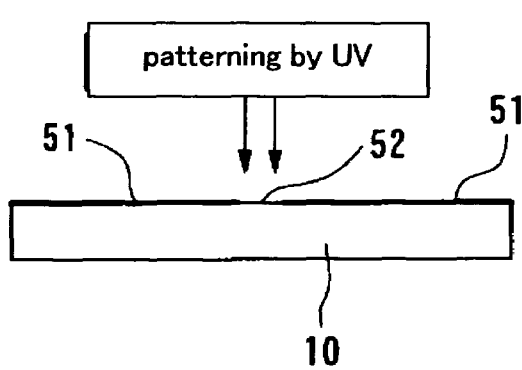
FIGS. 11A and 11B are schematic side views showing another method of manufacturing related to an exemplary embodiment of the present invention.
Figure 11B:
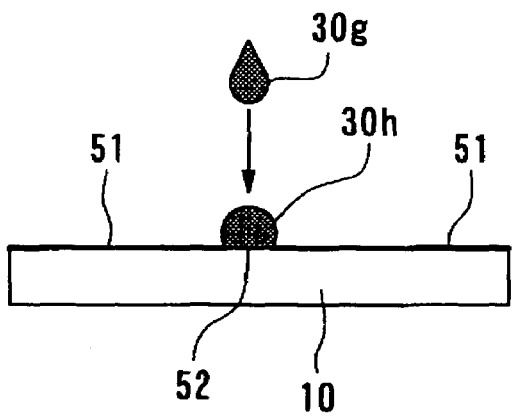

FIGS. 11A and 11B are schematic side views showing other examples of the method of manufacturing the optical wave-guide 30. First, the first and the second micro tile elements are bonded to a top surface of the substrate 10 before the manufacturing process of the optical wave-guide. Next, a lyophobic treatment is performed to install a lyophobic surface 51 on overall the top surfaces of the substrate 10, the first micro tile element, and the second micro tile element (not shown in the drawing).

Then, a lyophilic surface 52 of a desired pattern is installed in the lyophobic surface 51 by irradiating a desired pattern area in the lyophobic surface 51 with ultraviolet ray, and the like. Subsequently, a liquid optical wave-guide member 30*g* is dropped from an inkjet nozzle, a dispenser, or the like onto the lyophilic surface 52 as shown in FIG. 11B. A transparent resin or a sol-gel glass is used as the optical wave-guide member 30*g*. Further, an optical wave-guide 30*h* including the optical wave-guide member is formed by curing the optical wave-guide member 30*g* dropped onto the substrate 10.

In a case where the optical wave-guide 30*h* is formed by a sol-gel glass, a solvent hydrolyzed by adding an acid to a metal alkoxide to and the like is dropped from an ink jet nozzle, a dispenser, or the like onto the lyophilic surface 52. Then, the optical wave-guide 30*h* is formed by applying energy such as heat to the dropped solvent to vitrify it.

Figure 12A:
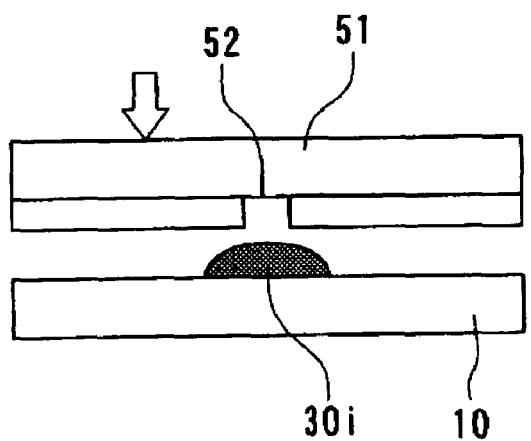
FIGS. 12A and 12B are schematic side views showing another method of manufacturing related to an exemplary embodiment of the present invention.
Figure 12B:
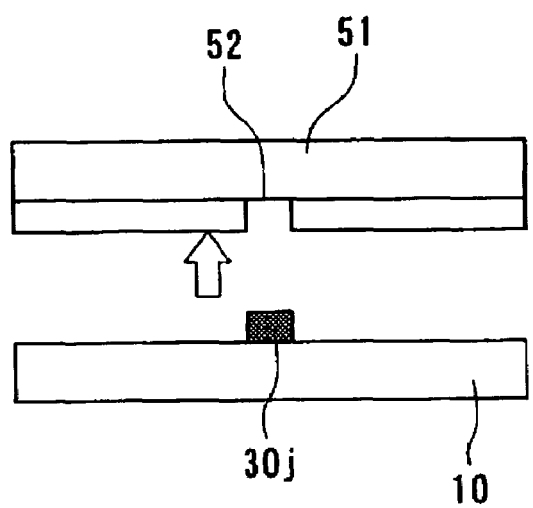

FIGS. 12A and 12B are schematic side views showing other examples of the method of manufacturing the optical wave-guide 30. First, the first and the second micro tile elements are bonded to a top surface of the substrate 10 before the manufacturing process of the optical wave-guide 30. Next, a liquid resin 30*i* is coated to cover an area, on which the optical wave-guide 30 is installed, on the top surfaces of the substrate 10, the first micro tile element, and the second micro tile element as shown in FIG. 12A.

Next, a stamper 51, which is a mold including a pattern shape 52 of the optical wave-guide 30, is pressed to a surface of the substrate 10 from above the substrate 10. Then, the stamper 51 is lifted up from the surface of the substrate 10 as shown in FIG. 12B. The above process forms an optical wave-guide 30*j* including the optical wave-guide member of a desired pattern on the substrate 10 by a pattern transferring method using the stamper 51.

Following methods other than the above methods shown in FIG. 9A through FIG. 12B may be used as the method of manufacturing the optical wave-guide 30. The optical wave-guide member constituting the optical wave-guide 30 may be installed by using, for example, a printing method such as a screen printing method or an offset printing method. In addition, the optical wave-guide member constituting the optical wave-guide 30 may be installed by using a slit coating method, in which a liquid resin is ejected from a slit-shaped gap. A method, in which a desired member, such as a resin, is applied to the substrate 10 by using capillary phenomenon, may be adopted as a slit coating method.

(Method of Manufacturing a Micro Tile Element)

A method of manufacturing the micro tile element constituting the first micro tile element 21 and the second micro tile element 22 is described below referring to FIG. 13 through FIG. 22. Though a case, where a compound semiconductor device (a compound semiconductor element) as the micro tile element is bonded onto a silicon LSI chip being a substrate, will be described in the present method of manufacturing, the present invention can be applied irrespective of kinds of semiconductor devices and LSI chips. Here, though "semiconductor substrate" in the present exemplary embodiment means a body including a semiconductor material, the shape of the substrate is not limited to the shape of a plate, and "semiconductor substrate" includes a substrate of any shape if only it includes a semiconductor material.

<First Process>

Figure 13:
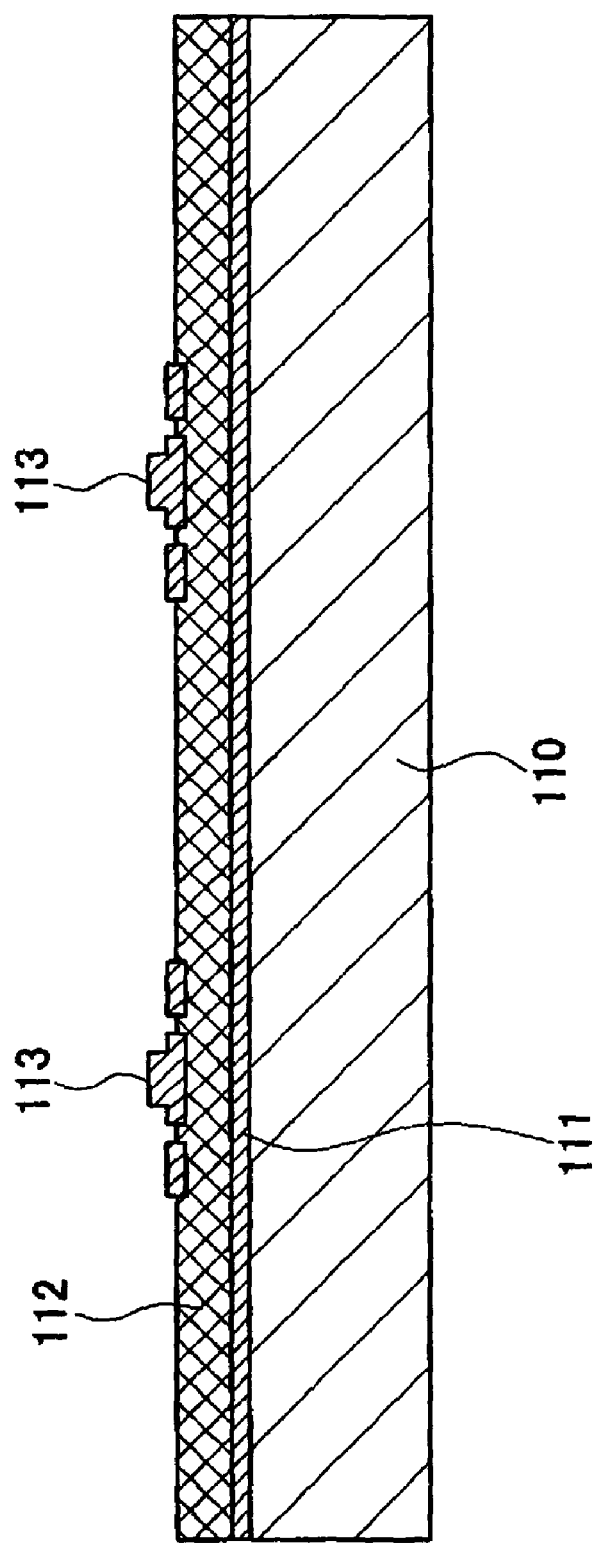
FIG. 13 is a schematic side view showing the first process of a method of manufacturing a micro tile element.

FIG. 13 is a schematic sectional view showing a first process of the method of manufacturing the micro tile element. In FIG. 13, a substrate 110 is a semiconductor substrate, and is, for example, a gallium arsenide compound semiconductor substrate. A sacrificial layer 111 is installed on a top layer of the substrate 110. The sacrificial layer 111 includes aluminum arsenide (AlAs), and is a layer of which the thickness is, for example, several hundred nm.

For example, a functional layer 112 is installed on the sacrificial layer 111. The thickness of the functional layer 112 is, for example, from about one (1) μm through about ten (10) (twenty) μm. In addition, a semiconductor device (a semiconductor element) 113 is formed on the functional layer 112. The semiconductor device 113 includes, for example, a light emitting diode (an LED), a vertical cavity surface emitting laser (a VCSEL), a photo diode (a PD), a DFB laser, and the like. Any of these semiconductor devices 113 is an element formed by depositing multi-layered epitaxial layers on the substrate 110. Further, an electrode is also formed on each semiconductor device 113 to perform an operation test.

<Second Process>

Figure 14:
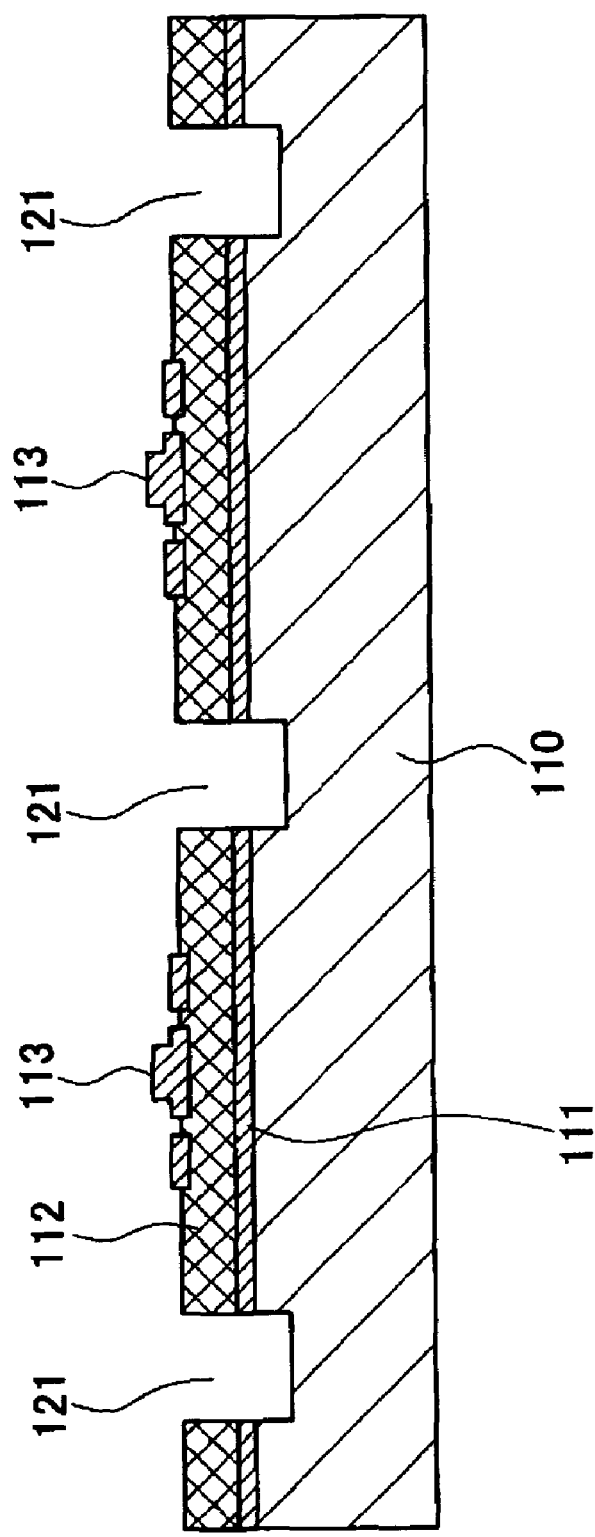
FIG. 14 is a schematic side view showing the second process of the method of manufacturing the micro tile element.

FIG. 14 is a schematic sectional view showing a second process of the method of manufacturing the micro tile element. In the present process, a isolation trench 121 is formed to isolate each semiconductor device 113. The isolation trench 121 is a trench having a depth to reach at least the sacrificial layer 111. For example, both the width and the depth of the isolation trench are from ten (10) μm through several hundred μm. In addition, the isolation trench 121 is a trench spreading without a dead-end to flow a selective etchant described later therein. Further, the isolation trench 121 is preferably formed in a lattice manner as a grid.

In addition, making an interval between the isolation trenches 121 be from several dozen μm to several hundred μm makes the size of each semiconductor device 113 isolated and defined by the isolation trench 121 be from several dozen μm square to several hundred μm square. A photolithography method and a dry or wet etching method are used as methods of forming the isolation trench 121. In addition, the isolation trench 121 may be formed by using a dicer of a U-shaped trench within a scope, where a crack is not generated in a substrate.

<Third Process>

Figure 15:
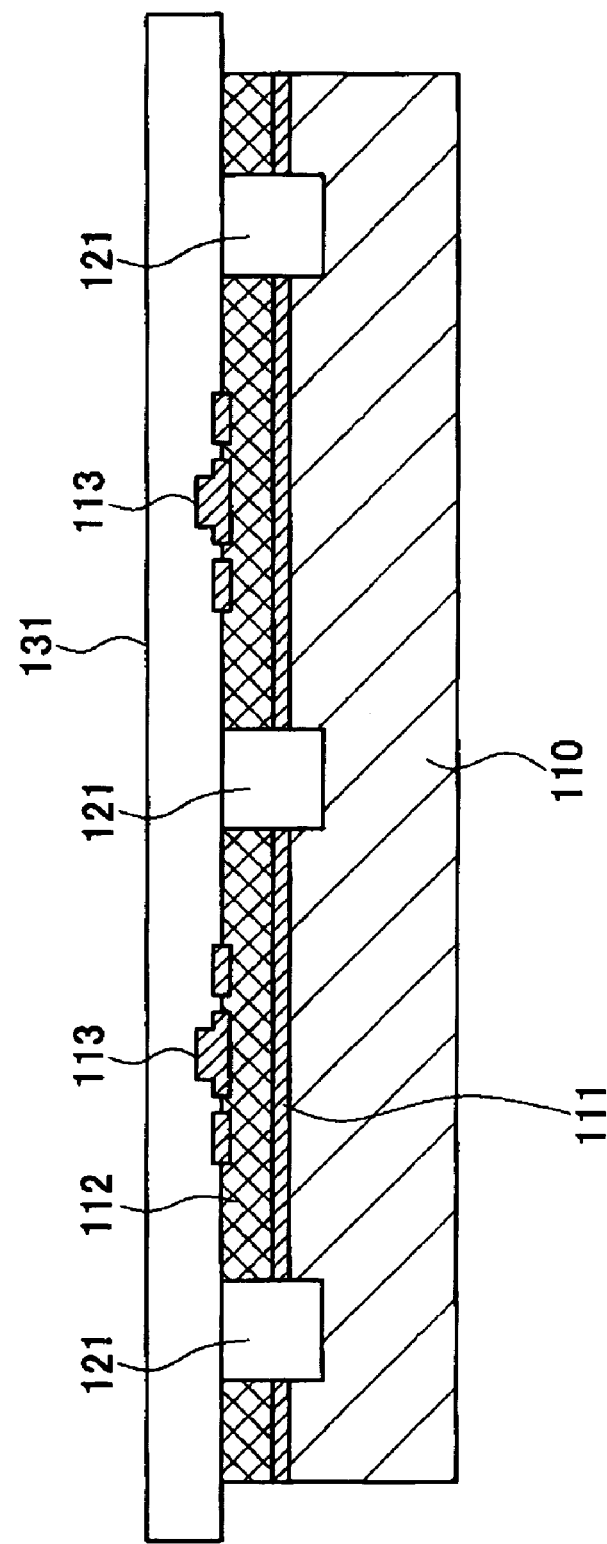
FIG. 15 is a schematic side view showing the third process of the method of manufacturing the micro tile element.

FIG. 15 is a schematic sectional view showing a third process of the method of manufacturing the micro tile element. In the present process, an intermediate transfer film 131 is attached to a surface of the substrate 110 (a semiconductor device 113 side). The intermediate transfer film 131 is a flexible belt-shaped film of which surface is coated with an adhesive.

<Fourth Process>

Figure 16:
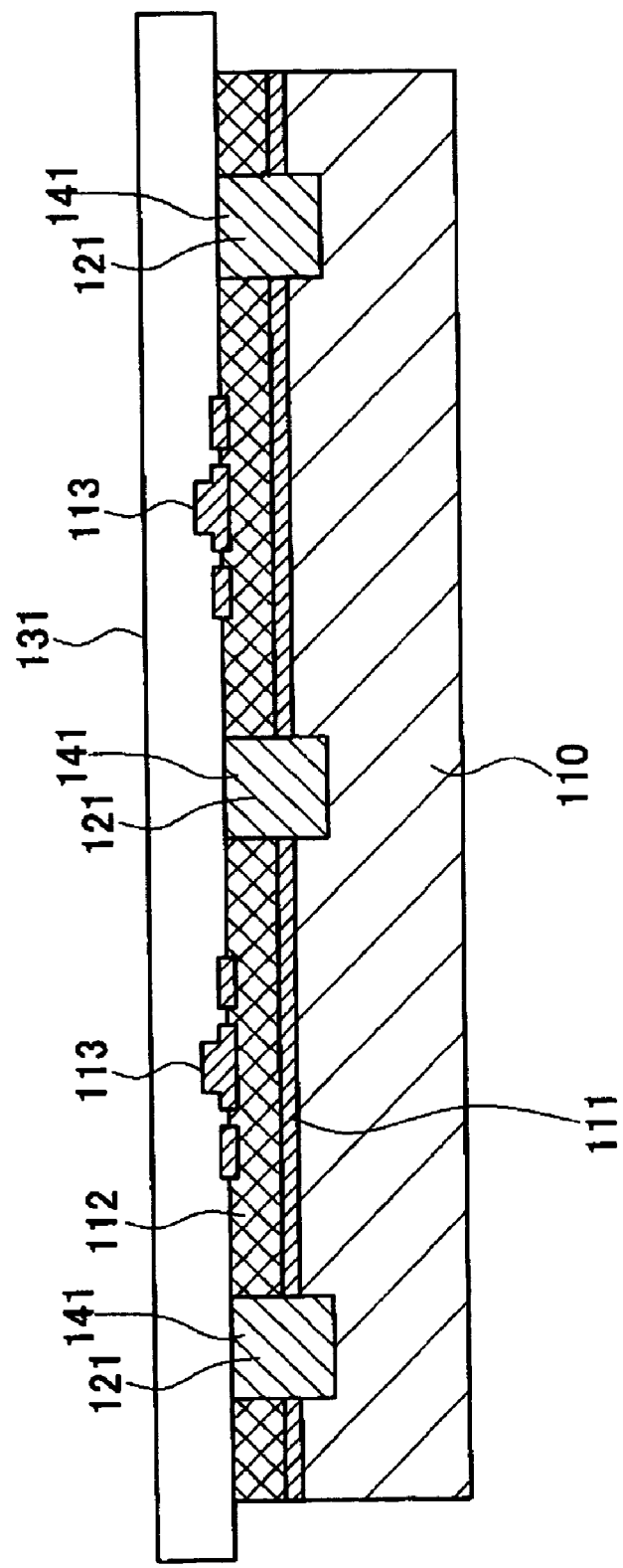
FIG. 16 is a schematic side view showing the fourth process of the method of manufacturing the micro tile element.

FIG. 16 is a schematic sectional view showing a fourth process of the method of manufacturing the micro tile element. In the present process, a selective etchant 141 is filled into the isolation trench 121. In the present process, a hydrochloric acid of low concentration, which is highly selective to aluminum and arsenic, is used as the selective etchant 141 in order to selectively etch only the sacrificial layer 111.

<Fifth Process>

Figure 17:
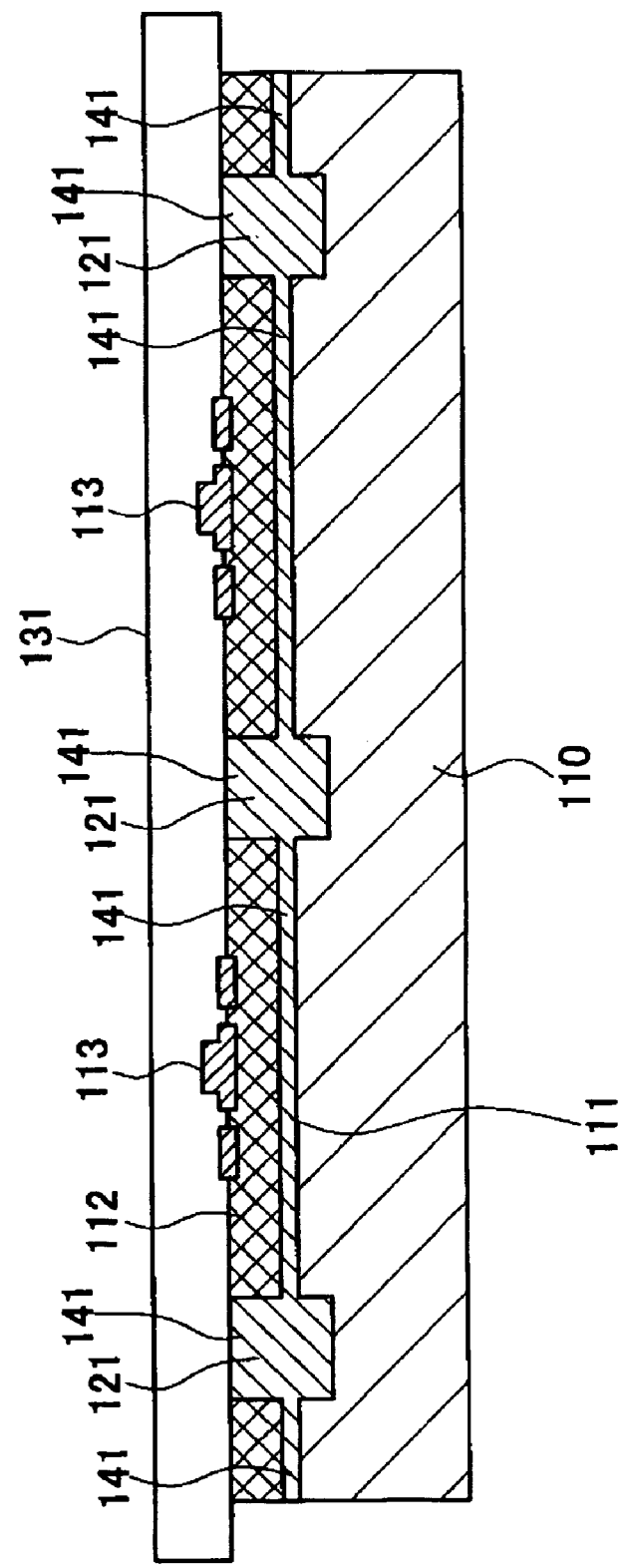
FIG. 17 is a schematic side view showing the fifth process of the method of manufacturing the micro tile element.

FIG. 17 is a schematic sectional view showing a fifth process of the method of manufacturing the micro tile element. In the present process, when a predetermined time passes after filling the selective etchant 141 into the isolation trench 121 in the fourth process, all of sacrificial layer 111 is selectively etched so as to be removed from the substrate 110.

<Sixth Process>

Figure 18:
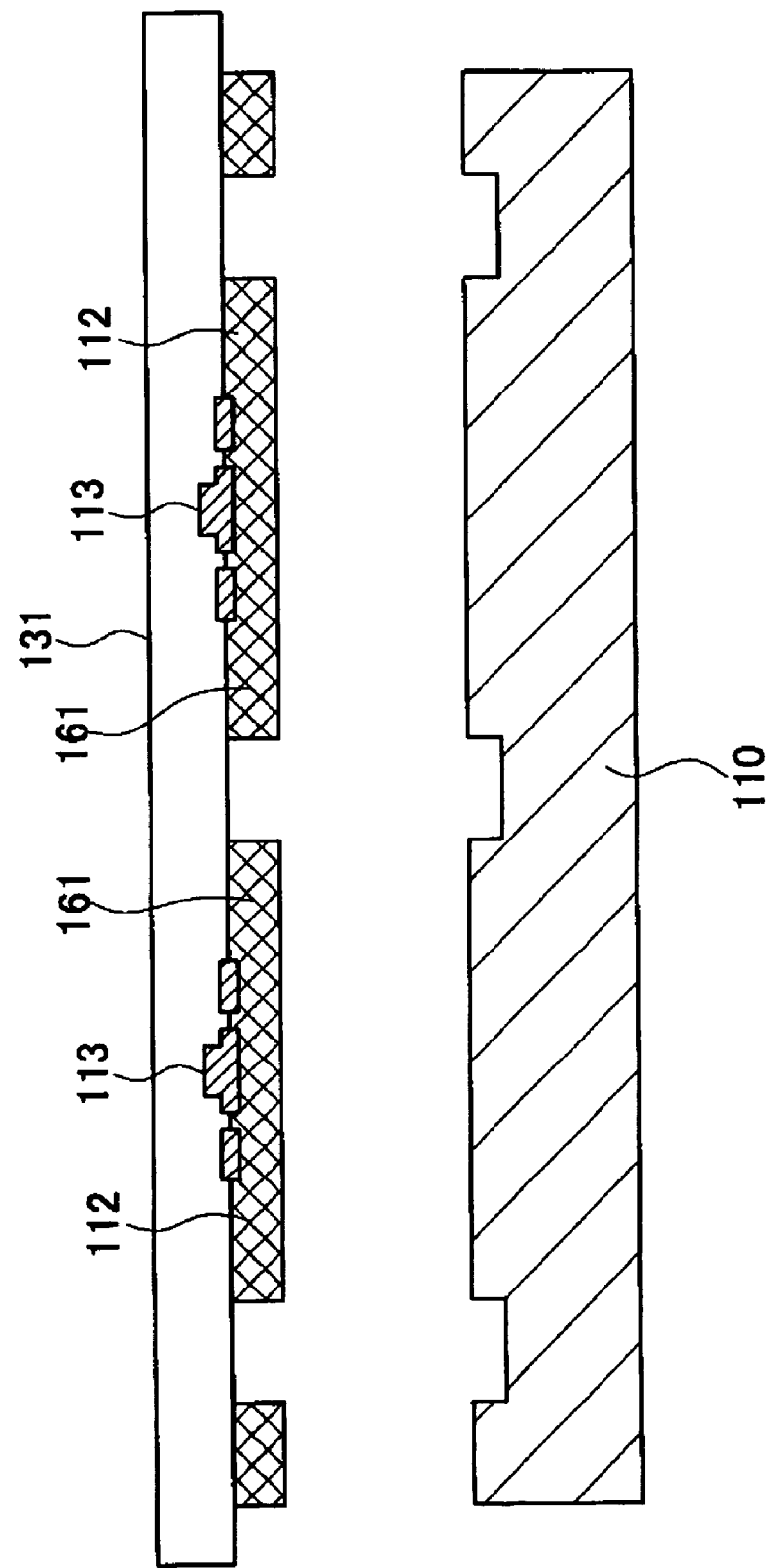
FIG. 18 is a schematic side view showing the sixth process of the method of manufacturing the micro tile element.

FIG. 18 is a schematic sectional view showing a sixth process of the method of manufacturing the micro tile element. When all of sacrificial layer 111 is etched in the fifth process, the functional layer 112 is separated from the substrate 110. In addition, in the present process, separating the intermediate transfer film 131 from the substrate 110 makes the functional layer 112 attached to the intermediate transfer film 131 be separated from the substrate 110.

According to the above processes, forming the isolation trench 121 and etching the sacrificial layer 111 allows the functional layer 112, on which the semiconductor device 113 is formed, to be isolated so as to become a semiconductor element ("micro tile element" in the above exemplary embodiment) of predetermined shape (for example, the shape of a micro tile) and be retained on the intermediate transfer film 131 attached to it. It is preferable that the thickness of the functional layer is, for example, from one (1) μm to eight (8) μm, and the size (the length and the width) thereof is, for example, from several dozen μm to several hundred μm.

<Seventh Process>

Figure 19:
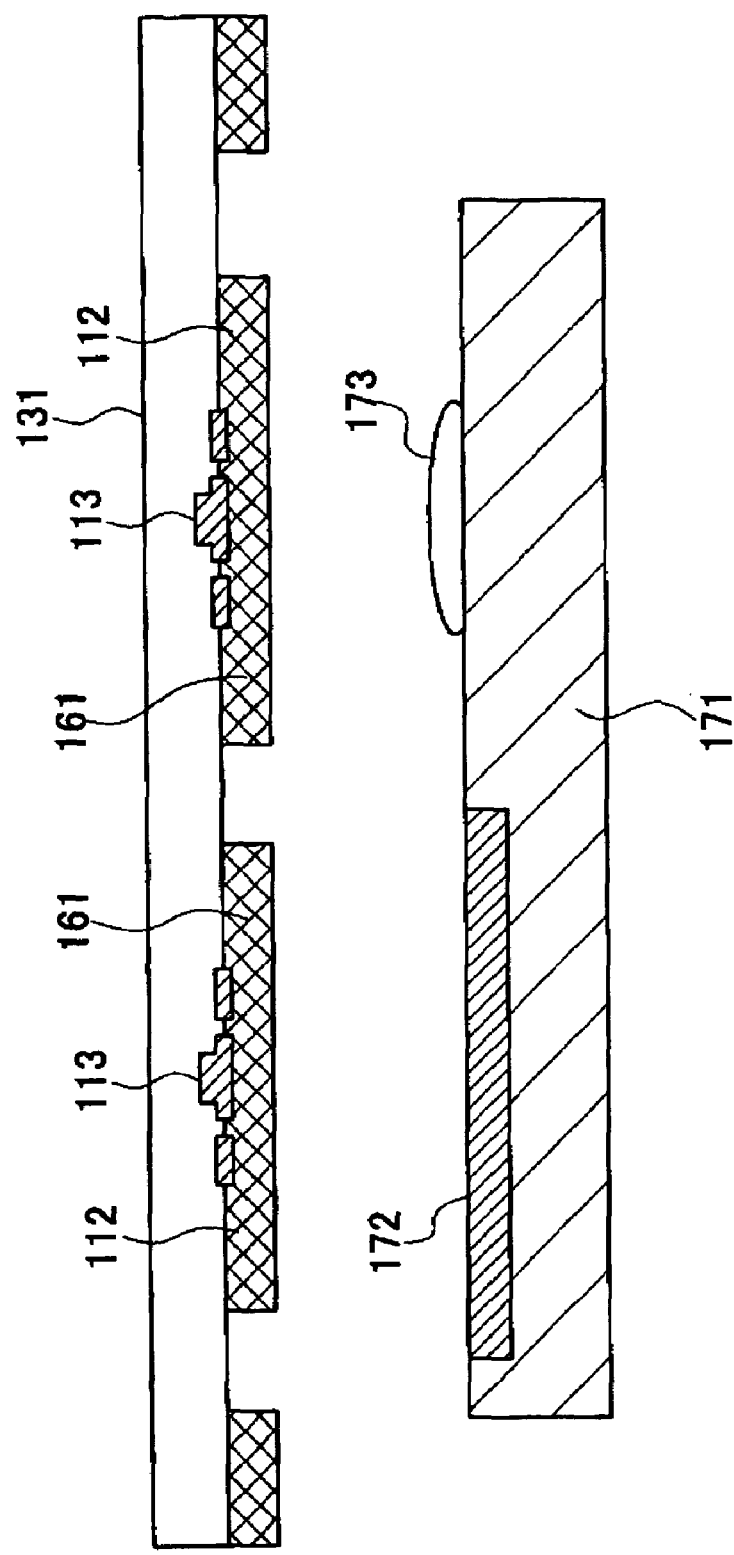
FIG. 19 is a schematic side view showing the seventh process of the method of manufacturing the micro tile element.

FIG. 19 is a schematic sectional view showing a seventh process of the method of manufacturing the micro tile element. In the present process, a micro tile element 161 is aligned with a desired position of a final substrate 171 by moving the intermediate transfer film 131 (to which the micro tile element 161 is attached). Here, the final substrate 171 is made of, for example, a silicon semiconductor (the substrate 10 of FIG. 1) and includes an LSI area 172 formed thereon. In addition, the desired position of the final substrate 171 is coated with an adhesive 173 to bond the micro tile element 161.

<Eighth Process>

Figure 20:
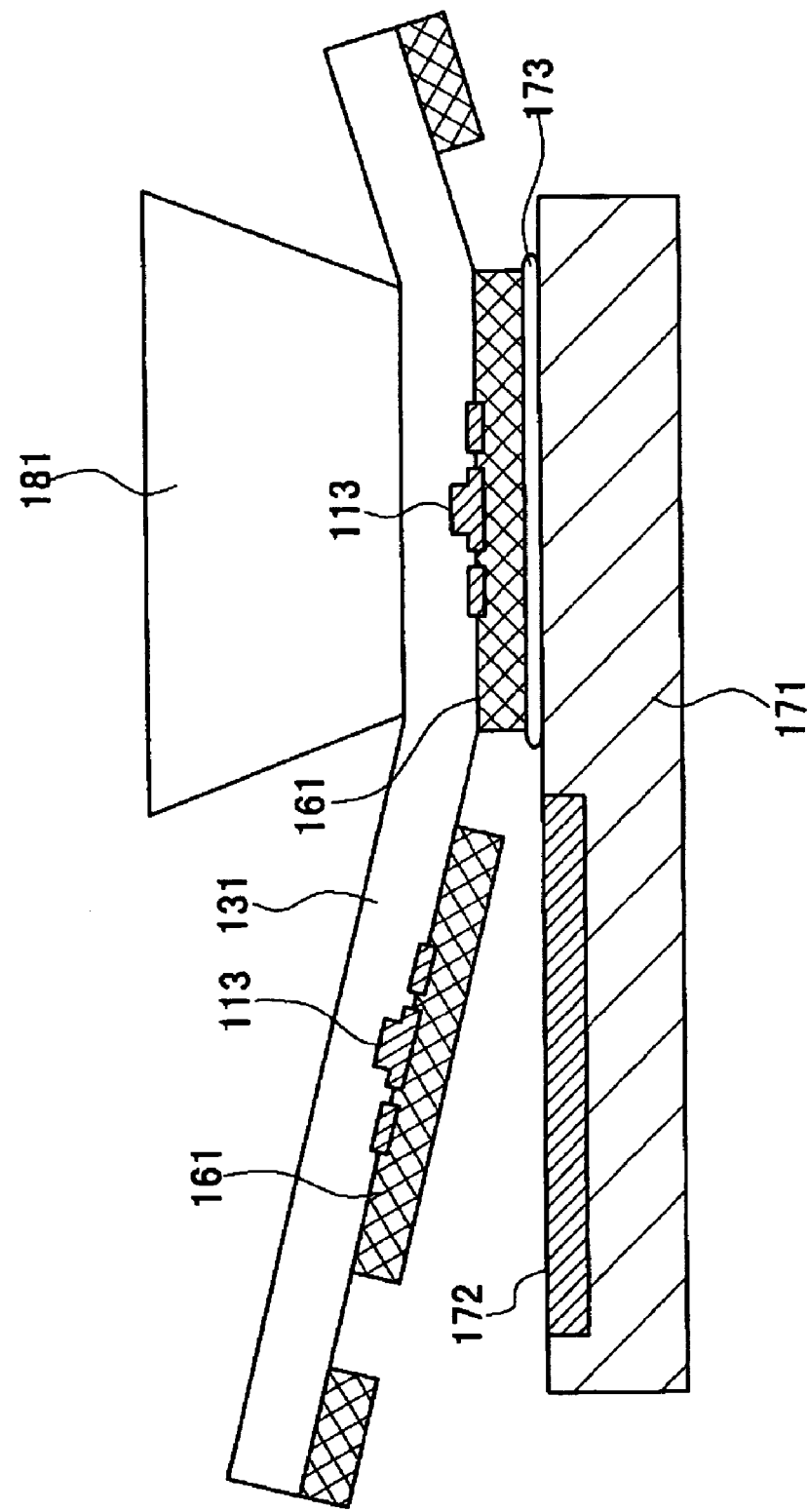
FIG. 20 is a schematic side view showing the eighth process of the method of manufacturing the micro tile element.

FIG. 20 is a schematic sectional view showing an eighth process of the method of manufacturing the micro tile element. In the present process, the micro tile element 161 aligned with the desired position of the final substrate 171 is pressed to the final substrate 171 through the intermediate transfer film 131 by a back-pushing pin 181 so as to be bonded to the final substrate 171. Here, the desired position is coated with the adhesive 173 such that the micro tile element 161 is bonded to the desired position of the final substrate 171.

<Ninth Process>

Figure 21:
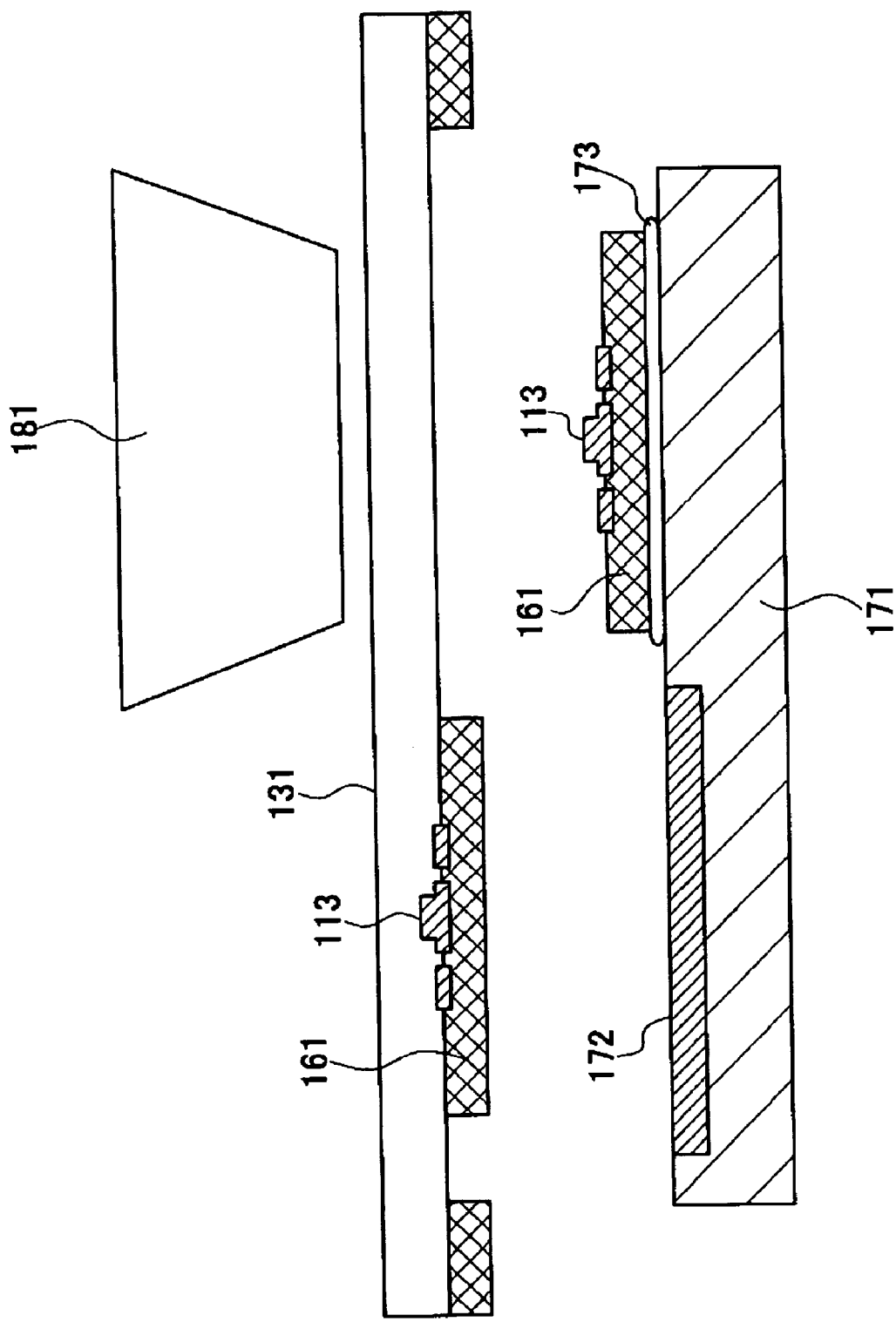
FIG. 21 is a schematic side view showing the ninth process of a method of manufacturing the micro tile element.

FIG. 21 is a schematic sectional view showing a ninth process of the method of manufacturing the micro tile element. In the present process, adhesion of the intermediate transfer film 131 is eliminated so as to peel the intermediate transfer film 131 from the micro tile element 161.

The adhesive of the intermediate transfer film 131 losses adhesion by ultraviolet ray (UV) or heat. When the adhesive is UV curable, making the back-pushing pin 181 be formed by a transparent material and irradiating ultraviolet ray (UV) from a tip of the back-pushing pin 181 cause the adhesion of the intermediate transfer film 131 to be eliminated. When the adhesive is heat curable, it is sufficient that the back-pushing pin 181 is heated. Alternatively, the adhesion of overall the intermediate transfer film 131 may be eliminated to some extent by irradiating overall the intermediate transfer film 131 with ultraviolet ray. Even if the adhesion disappears to some extent, actually the adhesion remains somewhat, and the micro tile element 161 is very thin and light such that the intermediate transfer film 131 retains it.

<Tenth Process>

The present process is not shown in a drawing. In the present process, the micro tile element 161 is definitely bonded to the final substrate 171 by heat treatment and the like.

<Eleventh Process>

Figure 22:
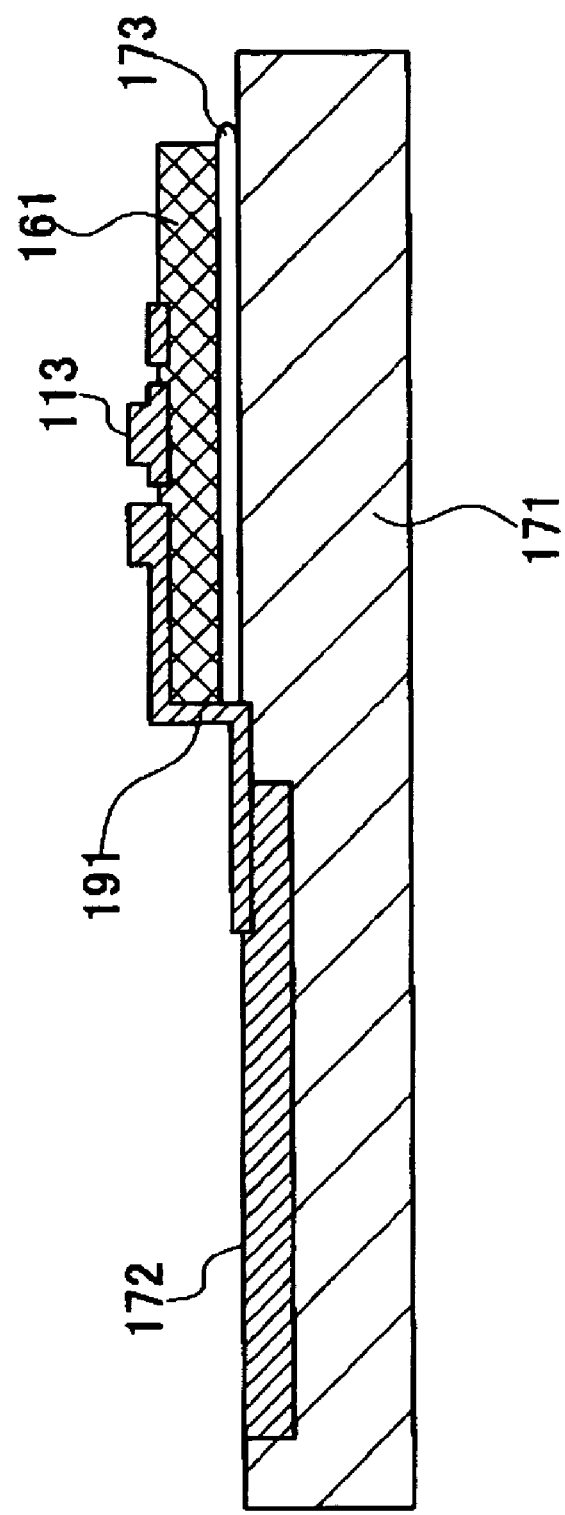
FIG. 22 is a schematic side view showing the eleventh process of the method of manufacturing the micro tile element.

FIG. 22 is a schematic sectional view showing an eleventh process of the method of manufacturing the micro tile element. In the present process, an electrode of the micro tile element 161 and a circuit on the final substrate 171 is electrically connected with a wiring 191 so as to complete one LSI chip (integrated circuit chip for the optical interconnection circuit) and the like. A quarts substrate or a plastic film as well as a silicon semiconductor may be applied as the final substrate 171.

EXAMPLE

Application examples of the optical interconnection circuit related to the present invention are described below.

As a first example, the optical interconnection circuit of the above exemplary embodiment is used as a signal transmission device in an opto-electronics integrated circuit. The opto-electronics integrated circuits include, for example, a computer. Further, though signal processing in an integrated circuit constituting a CPU is performed by using an electrical signal, the optical interconnection circuit of the above exemplary embodiment is applied to a bus transmitting a data between a CPU and a storage device and the like.

According to an example where the present invention is applied, a signal transmission speed at a bus, which is a bottleneck of a processing speed of a computer, can be substantially enhanced compared to a related art one, despite a simple constitution.

In addition, according to the example where the present invention is applied, a computer and the like can be substantially downsized.

As a second example, the optical interconnection circuit of the above exemplary embodiment is used for a flat display device, which is an electro-optical device, such as a liquid crystal display, a plasma display, and an organic EL (electro luminescence) display. For example, the optical interconnection circuit is used as a scanning line of a flat display device. Then, a scanning signal can be transmitted at high speed such that increase in the size and the quality of a screen in a flat display device can be promoted.

Further, depositing the optical wave-guide 30 on a metal wiring pattern of a flat display device enables aperture ratio to be increased such that an image of high quality can be displayed.

(Electronic Equipment)

Examples of electronic equipment including the optical interconnection circuit of the above exemplary embodiment are described below.

Figure 23:
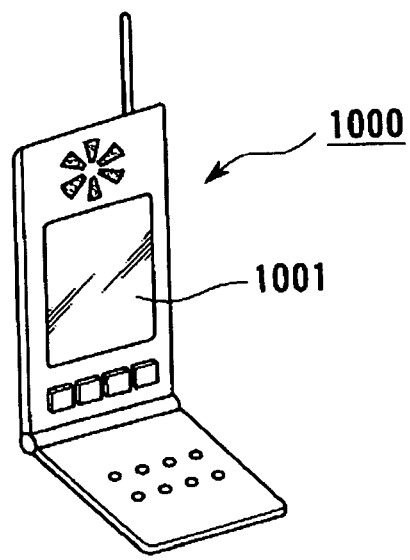
FIG. 23 is a schematic showing one example of electronic equipment including the circuit of the present exemplary embodiment.

FIG. 23 is a perspective view showing one example of a cellular phone. In FIG. 23, reference numerals 1000 and 1001 show a main body of a cellular phone using the optical interconnection circuit and a display part using the electro-optical device, respectively.

Figure 24:
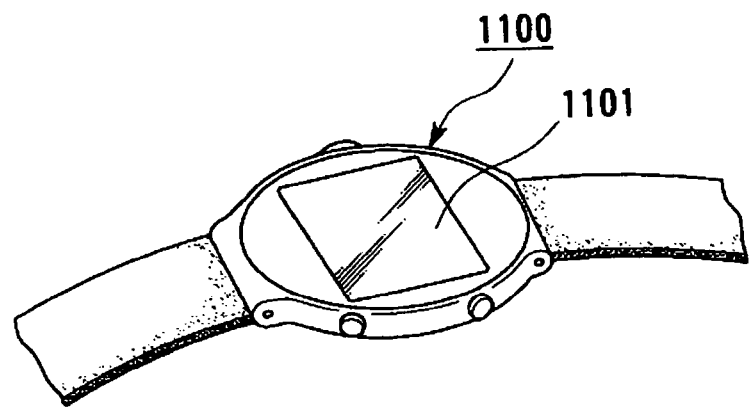
FIG. 24 is a schematic showing one example of electronic equipment including the circuit of the present exemplary embodiment.

FIG. 24 is a perspective view showing one example of wristwatch type electronic equipment. In FIG. 24, reference numerals 1100 and 1101 show a main body of wristwatch type electronic equipment using the optical interconnection circuit and a display part using the electro-optical device, respectively.

Figure 25:
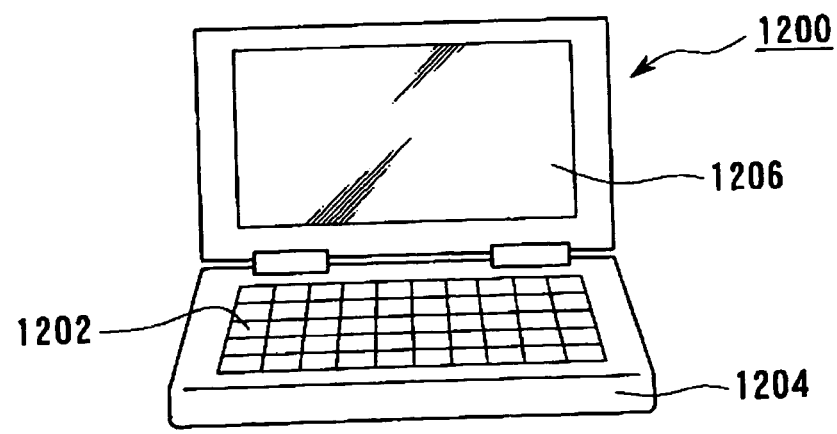
FIG. 25 is a schematic showing one example of electronic equipment including the circuit of the present exemplary embodiment.

FIG. 25 is a perspective view showing one example of a portable information processing device, such as a word processor and a personal computer, for example. In FIG. 25, reference numerals 1200, 1202, 1204, and 1206 show an information processing device, a input part such as a keyboard, a main body of an information processing device using the optical interconnection circuit, and a display part using the electro-optical device, respectively.

The electronic equipment shown in FIG. 23 through FIG. 25 includes the optical interconnection circuit or the electro-optical device of the above exemplary embodiment such that electronic equipment including a display part, which is superior in display quality, and especially, of which a screen responds at high speed and is bright and large. In addition, using the optical interconnection circuit of the above exemplary embodiment enables electronic equipment to be downsized than a related art one. Furthermore, using the optical interconnection circuit of the above exemplary embodiment enables manufacturing cost to be reduced than a related art one.

The scope of the art of the present invention is not limited to the above exemplary embodiments but applied to various kinds of modifications within the spirit of the present invention. The specifically disclosed materials, constitution, and the like included in the exemplary embodiments are just examples and can be accordingly modified.

What is claimed is:

1. An optical interconnection circuit, comprising:
   a substrate;
   a first element that has a light emitting function and that is fixed on the substrate by an adhesive;
   a second element that has a light receiving function and that is fixed on the substrate by an adhesive; and
   an optical wave-guide that is formed on the substrate,
   the second element receiving a light emitted by the first element through the optical wave-guide,
   the optical wave-guide covering a part of the first element and a part of the second element,
   the optical wave-guide contacting the part of the first element and the part of the second element, and
   the optical wave-guide having a function to transmit an optical signal emitted from the first element to the second element.

2. The optical interconnection circuit claimed in claim 1, the optical wave-guide being installed in a linear or planar manner on the substrate.

3. The optical interconnection circuit claimed in claim 1, the optical wave-guide including a light scattering mechanism scattering light, and the optical wave-guide being installed in the vicinity of at least one of the first element and the second element.

4. The optical interconnection circuit claimed in claim 3, the light scattering mechanism being composed of a resin into which a light scattering particle is mixed.

5. The optical interconnection circuit claimed in claim 3, the light scattering mechanism being composed of a resin of which a surface is processed to comprise an irregularity thereon.

6. The optical interconnection circuit claimed in claim 3, the light scattering mechanism being composed of the optical wave-guide of which at least one of the line width and the height differ from the other part.

7. The optical interconnection circuit claimed in claim 3, the light scattering mechanism being composed of at least one of a resin and a glass in which a light scattering particle is dispersed, and is dome-shaped.

8. The optical interconnection circuit claimed in claim 7, the optical wave-guide being formed to cover the dome-shaped light scattering mechanism.

9. The optical interconnection circuit claimed in claim 1, the optical wave-guide including a light reflecting mechanism reflecting light, and the optical wave-guide being installed in the vicinity of at least one of the first element and the second element or on an edge part of the optical wave-guide.

10. The optical interconnection circuit claimed in claim 9, the light reflecting mechanism including a metal film formed on a surface of the optical wave-guide.

11. The optical interconnection circuit claimed in claim 9, the light reflecting mechanism being composed of the optical wave-guide of which a surface is coated with a coating material including a metal particle.

12. The optical interconnection circuit claimed in claim 9, the light reflecting mechanism including a reflection plate having a reflection plane attached to the edge part of the optical; wave-guide; and
   the reflection plate being disposed to be inclined to the substrate.

13. The optical interconnection circuit claimed in claim 12,
   the optical wave-guide being formed into the shape of a plurality of lines, which are approximately parallel each other, on the substrate; and
   the reflection plate being disposed on at least one edge of the plurality of lines, and being one common reflection plate reflecting light transmitting in each of the plural lines.

14. The optical interconnection circuit claimed in claim 1, the optical wave-guide being deposited on a metal wiring pattern installed on the substrate.

15. The optical interconnection circuit claimed in claim 1, the thickness of the first element and the second element being twenty μm or less.

16. The optical interconnection circuit claimed in claim 1, the first element being one of an LED, a surface emitting laser, and a DFB laser.

17. The optical interconnection circuit claimed in claim 1, the second element being a surface photodiode or a phototransistor.

18. The optical interconnection circuit claimed in claim 1, a third element being stacked on the first element.

19. The optical interconnection circuit claimed in claim 18,
   the third element including a detecting device that controls light emitted from the first element, and a controlling device that controls light emitting operation of the first element based on the detected quantity of emitted light.

20. The optical interconnection circuit claimed in claim 1, each of the first element and the second element being electrically connected to an electronic circuit installed on the substrate.

21. An electro-optical device, comprising:
the optical interconnection circuit claimed in claim 1.

22. Electronic equipment, comprising:
the optical interconnection circuit claimed in claim 1.

23. A method of manufacturing an optical interconnection circuit, comprising:
bonding a plurality of elements to a substrate; and
installing an optical wave-guide on the substrate to connect at least two elements to each other,
the optical wave-guide being formed on the substrate to cover a part of a first element and a part of a second element, the optical wave-guide contacting the part of the first element and the part of the second element and the optical wave-guide having a function to transmit an optical signal emitted from the first element to the second element.

24. The method of manufacturing an optical interconnection circuit claimed in claim 23,
the plurality of elements including a first element emitting an optical signal and a second element receiving the optical signal; and the optical wave-guide being installed to transmit the optical signal emitted from the first element to the second element.

25. The method of manufacturing an optical interconnection circuit claimed in claim 23,
the optical wave-guide being installed by coating the substrate and at least one of the first and second elements with a light curable resin, thereafter irradiating only an area of a desired pattern with light for patterning.

26. The method of manufacturing an optical interconnection circuit claimed in claim 25,
the coating being performed by using at least one of a spin coating method, a roll coating method, and a spray coating method.

27. The method of manufacturing an optical interconnection circuit claimed in claim 23, the optical wave-guide being installed by coating the substrate and at least one of the first and second elements with a desired resin, thereafter using a photolithography metod to pattern desired shape.

28. The method of manufacturing an optical interconnection circuit claimed in claim 23,
the optical wave-guide being installed by using a droplet ejecting method.

29. The method of manufacturing an optical interconnection circuit claimed in claim 28, the optical wave-guide being installed by installing a lyophobic area and a lyophilic area, which have a desired pattern, on the substrate and a surface of the plurality of elements, thereafter ejecting a resin onto the substrate and the plurality of elements by the droplet ejecting method.

30. The method of manufacturing an optical interconnection circuit claimed in claim 23,
the optical wave-guide being installed by a pattern transferring method using a stamper.

31. The method of manufacturing an optical interconnection circuit claimed in claim 23,
the optical wave-guide being installed by using a printing method.

32. The method of manufacturing an optical interconnection circuit claimed in claim 23,
the optical wave-guide being installed by using a slit coating method in which a liquid resin is ejected from a slit-shaped gap.

* * * * *